(12) United States Patent
Park et al.

(10) Patent No.: US 9,971,467 B2
(45) Date of Patent: May 15, 2018

(54) TOUCH SENSING UNIT AND ELECTRONIC DEVICE HAVING SAME

(71) Applicant: Samsung Display Co., Ltd., Yongin-si (KR)

(72) Inventors: Yong-hwan Park, Cheonan-si (KR); Nayun Kwak, Cheonan-si (KR); Jongseok Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/348,102

(22) Filed: Nov. 10, 2016

(65) Prior Publication Data

US 2017/0364175 A1    Dec. 21, 2017

(30) Foreign Application Priority Data

Jun. 21, 2016  (KR) ........................ 10-2016-0077493

(51) Int. Cl.
*G06F 3/041*    (2006.01)
*G06F 3/044*    (2006.01)

(52) U.S. Cl.
CPC ............ *G06F 3/044* (2013.01); *G06F 3/0412* (2013.01); *G06F 2203/04111* (2013.01); *G06F 2203/04112* (2013.01)

(58) Field of Classification Search
CPC .............................. G06F 3/03547; G06F 3/044
USPC .................................................. 345/173–178
See application file for complete search history.

(56) References Cited

U.S. PATENT DOCUMENTS

| 2010/0149108 A1* | 6/2010 | Hotelling | G06F 3/044 345/173 |
| 2011/0048812 A1* | 3/2011 | Yilmaz | G06F 3/044 178/18.06 |
| 2011/0090159 A1* | 4/2011 | Kurashima | G06F 3/044 345/173 |
| 2011/0148435 A1* | 6/2011 | Schwartz | G06F 3/0416 324/658 |
| 2011/0210935 A1* | 9/2011 | Chuang | G06F 3/0412 345/174 |
| 2011/0279409 A1* | 11/2011 | Salaverry | G06F 3/0416 345/174 |

FOREIGN PATENT DOCUMENTS

| JP | 2012-033147 | 2/2012 |
| KR | 10-2015-0069568 | 6/2015 |
| KR | 10-2015-0101668 | 9/2015 |

* cited by examiner

*Primary Examiner* — Roy Rabindranath
(74) *Attorney, Agent, or Firm* — H.C. Park & Associates, PLC

(57) ABSTRACT

An electronic device including: a first pattern part including first mesh lines in which a plurality of first cut line parts are defined; and a second pattern part spaced apart from the first pattern part in a first direction and including a plurality of second cut line parts in which a plurality of second cut line parts are defined. A first reference region is defined in the first pattern part; a second reference region having a same width and area as the first reference region in a second direction crossing the first direction is defined.

21 Claims, 16 Drawing Sheets

TOUCH SENSING UNIT AND ELECTRONIC DEVICE HAVING SAME

CROSS-REFERENCE TO RELATED APPLICATION

This application claims priority from and the benefit of Korean Patent Application No. 10-2016-0077493, filed on Jun. 21, 2016, which is hereby incorporated by reference for all purposes as if fully set forth herein.

BACKGROUND

Field

Exemplary embodiments of the invention relate to a touch sensing unit and an electronic device having the same. More particularly, exemplary embodiments relate to a touch sensing unit and an electronic device having the same which have improved visibility with regard to reflection of external light.

Discussion of the Background

Electronic devices are activated by being applied an electrical signal. The electronic devices each include a touch screen for detecting a touch applied from a display apparatus displaying an image or from the outside. The electronic devices may include various electrode patterns so as to be activated by an electronic signal. The region in which the electrode patterns are activated displays information or responds to a touch applied from the outside.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the invention provide a touch sensing unit and an electronic device having the same that are able to prevent touch sensors from being viewed due to reflection of external light.

Additional aspects will be set forth in the detailed description which follows, and, in part, will be apparent from the disclosure, or may be learned by practice of the inventive concept.

An exemplary embodiment of the invention discloses an electronic device including: a base layer; a first pattern part disposed on one surface of the base layer, the first pattern part including: first lines arrayed in a first direction, each of the first lines extending in a second direction crossing the first direction; a first pattern line, which is disposed between the first lines and in which first cut line parts are defined; second lines disposed in the second direction, each second line extending in the first direction; and a second pattern line, which is disposed between the second lines and in which second cut line parts are defined; and a second pattern part disposed on one surface of the base layer and spaced apart from the first pattern part in the first direction, the second pattern part including third lines arrayed in the first direction, each third line extending in the second direction, and fourth lines disposed in the second direction, each fourth line extending in the first direction. A first reference region is defined in the first pattern part; a configuration repeating unit, which is a minimum repeating unit of the second lines and the second pattern line, which are arrayed in the second direction, is disposed in the first reference region; a second reference region, which overlaps the first and second pattern parts, is defined; the second reference region is spaced apart from the first reference region in the first direction and has the same area as the first reference region; a width of each of the second cut line parts in the first direction is defined as a first width; and a difference between a first value, which is the number of second cut line parts disposed in the first reference region among the second cut line parts multiplied by the first width, and a second value, which is a total sum of a minimum spaced distance between the first and second pattern parts which are disposed in the second reference region, is less than the second value.

An exemplary embodiment of the invention also discloses a touch sensing unit including: a first pattern part including first mesh lines in which a plurality of first cut line parts are defined; and a second pattern part spaced apart from the first pattern part in a first direction and including a plurality of second cut line parts in which a plurality of second cut line parts are defined. A first reference region may be defined in the first pattern part; a second reference region having a same width and area as the first reference region in a second direction crossing the first direction may be defined; and a difference between the first value, which is a number of first cut line parts disposed in the first reference region among the first cut line parts multiplied by a width of each of the plurality of first cut line parts in the first direction, and the second value, which is a total sum of a minimum spaced distance between the first and second pattern parts which are disposed in the second reference region, may be less than the second value.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
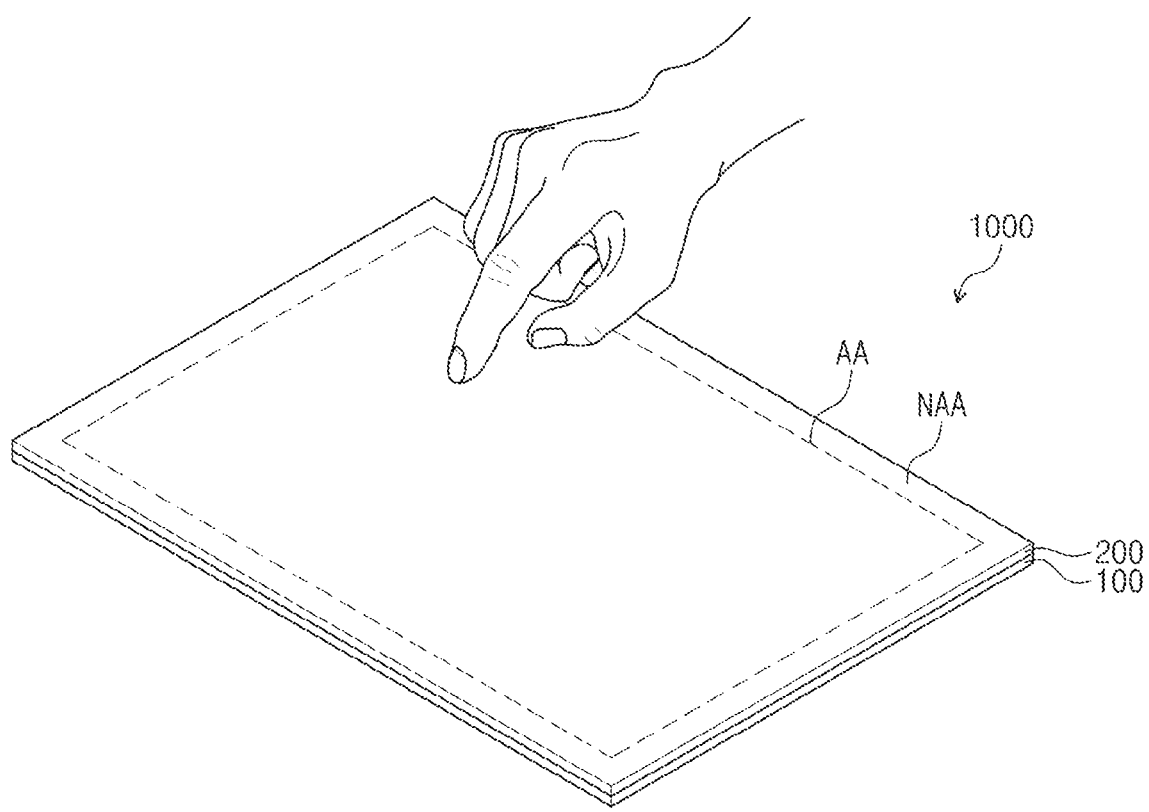
FIG. 1 is a perspective view of an electronic device according to an exemplary embodiment of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" is another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted is accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless is expressly so defined herein.

FIG. 1 is a perspective view of an electronic device according to an exemplary embodiment of the invention.

Referring to FIG. 1, an electronic device 1000 may be a device detecting a touch applied from the outside. The touch applied form the outside may be provided in various ways. FIG. 1 illustrates an example in which a portion of a body, such as a hand of a user, approaches or is brought into contact with the electronic device 1000 is detected as a touch. However, this illustrates only one example, and the electronic device 1000 may detect a touch when a portion of an intangible object, such as a stylus pen, approaches or is brought into contact with the electronic device 1000. Also, the electronic device 1000 may detect a touch through various methods including optical, contact-type, thermal sensitive, or magnetic methods.

FIG. 1 illustrates an exemplary embodiment using a flat electronic device as an example, but the inventive concept is not limited thereto. For example, the inventive concept may be applied to various electronic devices, such as curved, foldable, or stretchable electronic devices. These are merely examples and may, of course, be used for other electronic devices unless departing from the inventive concept.

The electronic device 1000 may be divided, when viewed in a plane, into an active region AA and a peripheral region NAA. When an electrical signal is applied, the active region AA is activated so as to detect an external touch.

FIG. 1 illustrates a state in which the active region AA is disposed on a central portion of the electronic device 1000, but the inventive concept is not limited thereto. For example, the active region AA may be defined to be biased to an edge or one side of the electronic device 1000 according to a use style of the electronic device 1000, and the inventive is concept is not limited to any one example.

The peripheral region NAA is defined adjacent to the active region AA. The electronic device 1000 does not detect an external touch applied to the peripheral region NAA. FIG. 1 illustrates an example in which the peripheral region NAA is defined to have a frame shape surrounding the active region AA.

The electronic device 1000 includes a base layer 100 and a touch sensing unit 200. The base layer 100 may be a base layer for disposing the touch sensing unit 200.

The base layer 100 may be an insulating substrate or an insulating film formed of an insulating material, such as glass, polymers, or the like. The base layer 100 may be a thin film layer in which a plurality of organic layers and/or a plurality of inorganic layers are laminated.

When the base layer 100 is an insulating substrate, the electronic device 1000 may have improved stiffness. When the base layer 100 is an insulating film, the electronic device 1000 may have improved flexibility. However, the base layer 100 is not limited to either of these examples.

The touch sensing unit 200 may be disposed on one surface of the base layer 100. FIG. 1 illustrates an example in which the touch sensing unit 200 is disposed on the upper surface of the base layer 100, but the inventive concept is not limited thereto. For example, the touch sensing unit 200 may be disposed on a lower surface of the base layer 100.

Figure 2:
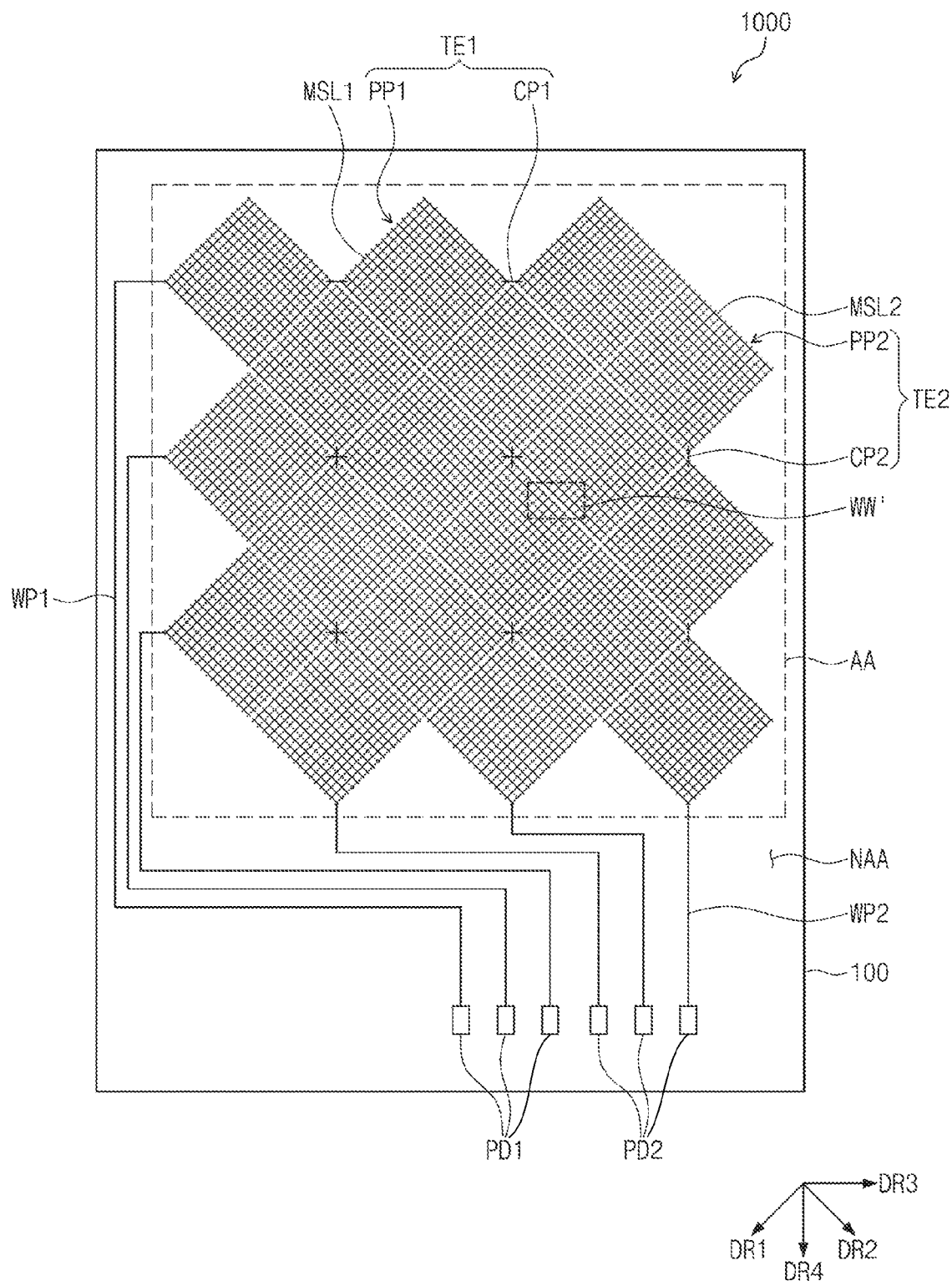
FIG. 2 is a plan view illustrating a partial configuration of the electronic device illustrated in FIG. 1.

FIG. 2 is a plan view illustrating a partial configuration of the electronic device illustrated in FIG. 1.

Referring to FIGS. 1 and 2, the touch sensing unit 200 may include a plurality of first electrodes TE1, a plurality of second electrodes TE2, a plurality of first lines WP1, a is plurality of second lines WP2, a plurality of first pads PD1, and a plurality of second pads PD2.

The touch sensing unit 200 may be operated in an electrostatic capacitive method, in which an external touch is detected through an electrostatic capacitance coupling between the first electrodes TE1 and the second electrodes TE2. In this case, the touch sensing unit 200 may obtain coordinate information of a touched point through a self-capacitance method or a mutual capacitance method.

The touch sensing unit 200 is not limited to be operated in an electrostatic capacitive method. For example, in another exemplary embodiment the touch sensing unit 200 may detect an external touch through various methods, such as a resistive film method, an electromagnetic inductive method, an ultrasonic method, a coordinate recognition method, or the like, and may have a corresponding electrode structure.

The first and second electrodes TE1 and TE2 may be disposed on the active region AA. The first electrodes TE1 may be arrayed in a fourth direction DR4, and the second electrodes TE2 may be arrayed in a third direction DR3.

The first electrodes TE1 may output sensing signals, and the second electrodes TE2 may receive driving signals. Here, the electronic device 1000 may scan the active region AA by applying driving signals to the second electrodes TE2, and may detect a region on which a touch is applied through the sensing signals output from the plurality of first electrodes TE1. However, in another exemplary embodiment, the first electrodes TE1 may receive driving signals, and the second electrodes TE2 may output sensing signals and may additionally receive or output electrical signals.

The first electrodes TE1 each may include a plurality of first pattern parts PP1 and a plurality of first connecting parts CP1, which are arrayed in the third direction DR3. The is second electrodes TE2 each may include a plurality of second pattern parts PP2 and a plurality of second connecting parts CP2, which are arrayed in the fourth direction DR4.

The first connecting parts CP1 may electrically connect the first pattern parts PP1 spaced apart from each other in the third direction DR3. The second connecting parts CP2 may electrically connect the second pattern parts PP2 spaced apart from each other in the fourth direction DR4.

A portion of the first and second connecting parts CP1 and CP2 may cross on layers different from each other in an insulated state. For example, when the first connecting parts CP1 are disposed on the same layer as the first pattern part PP1 and the second pattern parts PP2, the second connecting parts CP2 may be disposed on a layer different from the first connecting parts CP1 with an insulating layer (not shown) disposed therebetween, and may electrically connect the second pattern parts PP2.

In this case, the second connecting parts CP2 may be disposed between the first connecting parts CP1 and the base layer 100. However, this is only an example, and the first connecting parts CP1 may be disposed between the second connecting parts CP2 and the base layer 100.

Each of the first and second connecting parts CP1 and CP2 may have various shapes. FIG. 2 illustrates an example in which the first and second connecting parts CP1 and CP2 have a single line shape, but the inventive concept is not limited thereto, and each of the and second connecting parts CP1 and CP2 may have a mesh shape.

The first pattern parts PP1 each may include first mesh lines MSL1, and the second pattern parts PP2 each may include second mesh lines MSL2. Each of the first and second mesh lines MSL1 and MSL2 may include mesh lines which extend in the first direction is DR1 and is arrayed in the second direction DR2 crossing the first direction DR1 and mesh lines which extend in the second direction and arrayed in the first direction DR1. Each of the first and second directions DR1 and DR2 may cross each of the third and fourth directions DR3 and DR4.

The first and second pattern parts PP1 and PP2, which are adjacent to each other, may be spaced apart from each other. Accordingly, a portion without a mesh line may be defined between the first and second pattern parts PP1 and PP2 which are adjacent to each other and this may be defined as a boundary (BL of FIG. 3).

In using the electronic device 1000, external light may be incident on the electronic device 1000 from the outside. While external light is incident on the constituents disposed on the electronic device 1000, optical actions, such as reflection and/or transmission or the like, may be generated.

The modes of reflection may be different from each other in cases when external light is incident on a portion composed of mesh lines and when the external light is incident on a vacant space. For example, when being incident on a space composed of mesh lines, most of the external light is reflected and may be viewed as relatively bright by a user. In contrast, when the external light is incident on a vacant space without a mesh line, reflectivity of the external light is relatively decreased and may be viewed as relatively dark by a user.

The greater the difference in areas and distributions between the vacant space and the space in which mesh lines exist, the greater the sense of difference may be felt between the vacant space and the space in which mesh lines exist.

According to an exemplary embodiment, a plurality of cut line parts may be provided by cutting a portion of each of the first and second pattern parts PP1 and PP2. That is, vacant spaces corresponding to vacant spaces of a boundary (BL of FIG. 3) may be provided in is the first and second pattern parts PP1 and PP2. Accordingly, the difference in reflectivity between the boundary (BL of FIG. 3), the first pattern parts PP1 and the second pattern parts PP2 may be reduced. As a result, the boundary (BL of FIG. 3) may be prevented from being viewed due to the reflection of the external light.

The first and second lines WP1 and WP2 are disposed on the peripheral region NAA. The first lines WP1 may be respectively connected to the first electrodes TE1, and the second lines WP2 may be respectively connected to the second electrodes TE2.

The first and second pads PD1 and PD2 are disposed on the peripheral region NAA. The first and second pads PD1 and PD2 are respectively connected to the first and second lines WP1 and WP2.

The electronic device 1000 receives a power source voltage from an external power source through the first and second pads PD1 and PD2, and outputs signals corresponding to an external touch detected from the active region AA to the outside through the first and second pads PD1 and PD2.

In an exemplary embodiment, first and second pads PD1 and PD2 are illustrated to be sequentially arranged, but the first and second pads PD1 and PD2 may be disposed alternately with each other or partially separated from each other, and the inventive concept is not limited to any one disposition method.

Figure 3:
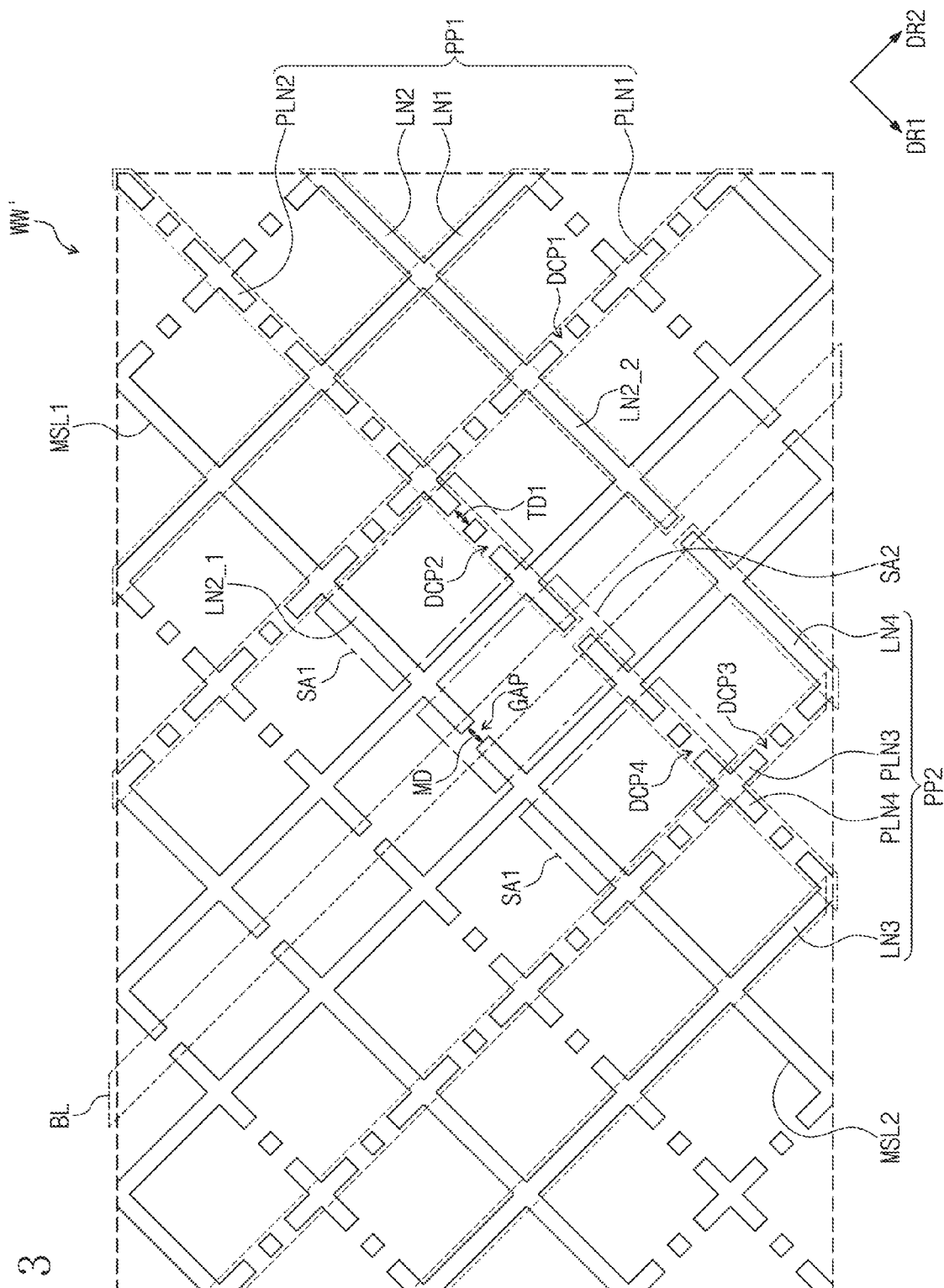
FIG. 3 is an enlarged plan view illustrating region WW' illustrated in FIG. 2.

FIG. 3 is an enlarged plan view illustrating region WW' illustrated in FIG. 2.

Referring to FIG. 3, the first pattern part PP1 may include a plurality of first mesh lines MSL1. In the first mesh lines MSL1, a plurality of cut line parts DCP1 and DCP2, in which a predetermined region is cut, may be defined.

More specifically, the first mesh lines MSL1 may include a first line LN1 in is which the cut line parts DCP1 and DCP2 are not defined, a second line LN2 in which the cut lines parts DCP1 and DCP2 are not defined, a first pattern line PLN1 in which the first cut line parts DCP1 are defined, and a second pattern line PLN2 in which the second cut line parts DCP2 are defined.

The first lines LN1 and the first pattern line PLN1 may be arrayed in the first direction DR1, and each of the first line LN1 and the first pattern line PLN1 may have a shape extending in the second direction DR2. The second lines LN2 and the second pattern line PLN2 may be arrayed in the second direction DR2, and the second line LN2 and the second pattern line PLN2 may have shapes extending in the first direction DR1.

In FIG. 3, dotted lines are shown to respectively surround one first line LN1, one first pattern line PLN1, one second line LN2, and one pattern line PLN2.

The first line LN1 and the first pattern line PLN1 may be alternately disposed, and the second line LN2 and the second pattern line PLN2 may be alternately disposed. That is, the first pattern line PLN1 may be disposed between the two first lines LN1 adjacent to each other, and the second pattern line PLN2 may be disposed between the two second lines LN2 adjacent to each other. The first line LN1, the first pattern line PLN2, the second line LN2, and the second pattern line PLN2 may be electrically connected to each other.

The second pattern part PP2 may be spaced apart from the first pattern part PP1 in the first direction DR1. The second pattern part PP2 may include a plurality of second mesh lines MSL2 in which a plurality of cut line parts DCP3 and DCP4 are defined.

In the second mesh lines MSL2, a plurality of cut line parts DCP3 and DCP4, in which a predetermined region is cut, may be defined. More specifically, the second mesh lines MSL2 may include a third line LN3, a fourth line LN4, a third pattern line PLN3, and a fourth is pattern line PLN4. Cut line parts may not be defined in the third and fourth lines LN3 and LN4, the third cut line parts DCP3 may be defined in the third pattern line PLN3, and the fourth cut line parts DCP4 may be defined in the fourth pattern lines PLN4.

In FIG. 3, dotted lines are shown to respectively surround one third line LN3, one third pattern line PLN3, one fourth line LN4, and one fourth pattern line PLN4.

The third lines LN3 and the third pattern line PLN3 may be alternately arrayed in the first direction DR1, and each of the third line LN3 and the third pattern line PLN3 may have a shape extending in the second direction DR2. The fourth lines LN4 and the fourth pattern line PLN4 may be alternately arrayed in the second direction DR2, and each of the fourth line LN4 and the fourth pattern line PLN4 may have a shape extending in the first direction DR1.

The fourth lines LN4 and the fourth pattern line PLN4 may be spaced apart from the second lines LN2 and the second pattern line PLN2 in the first direction DR1. A region between the second line LN2 and the fourth line LN4 and a region between the second pattern line PLN2 and the fourth pattern line PLN4 may overlap the boundary BL.

A separation distance MD between the second lines LN2 and fourth lines LN4, and a separation distance MD between the second pattern lines PLN2 and fourth pattern lines PLN4, may correspond to a minimum separation distance MD of the first pattern part PP1 and the second pattern part PP2.

In order to prevent the boundary BL from being viewed according to a difference between a reflectivity of each of the first and second pattern parts PP1 and PP2 and a reflectivity of the boundary BL, the cut line parts DCP1, DCP2, DCP3, and DCP4 may be provided inside each of the first and second pattern parts PP1 and PP2. This will be specifically described below.

A first reference region SA1 is defined in the first pattern part PP1, and a second reference region SA2 overlapping both the first and second pattern parts PP1 and PP2 is defined.

The first and second reference regions SA1 and SA2 may have the same area. The width of the first reference regions SA1 in the second direction DR2 may be the same as the width of the second reference regions SA2 in the second direction DR2. Accordingly, when the first reference region SA1 is moved in the first direction DR1, the first reference region SA1 may completely overlap the second reference region SA2.

Mesh lines extending in the second direction DR2 among the first mesh lines MSL1 may not be disposed in the first reference region SA1. A portion of a configuration repeating unit, which is a minimum repeating unit of the mesh lines extending in the first direction DR1 among the first mesh lines MSL1, may be disposed in the first reference region SA1.

When the configuration repeating unit of the mesh lines extending in the first direction DR1 is repeated in the second direction DR2, only a portion of one configuration repeating unit is disposed in the first reference region SA1, and other configuration repeating units adjacent to the one configuration repeating unit may not be disposed in the first reference region SA1.

More specifically, the second line LN2 and the second pattern line PLN2, which are mesh lines extending in the first direction DR1 among the first mesh lines MSL1, may be alternately arrayed one by one in the second direction DR2. Accordingly, the configuration repeating unit illustrated in FIG. 3 may be one second line LN2 and one second pattern line PLN2. That is, in the first reference region SA1, a portion of the one second line LN2 and a portion of the one second pattern line PLN2 may be disposed.

In an exemplary embodiment, the first line LN1 and the first pattern line PLN1 are not disposed in the first reference region SA1. Also, in the first reference region SA1, a portion of any one second line LN2_1 of the two second lines LN2_1 and LN2_2 adjacent to each other, and a portion of the second pattern line PLN2 disposed between the two second lines LN2_1 and LN2_2 may be disposed, and the other one second line LN2_2 may not be disposed.

A width of each of the second cut line parts DCP2, the width being parallel to the first direction DR1, is defined as a first width TD1. One or more second cut line parts may be disposed in the first reference region SA1. In this case, a "first value" may be defined as a value which is the first width TD1 multiplied by the number of second cut line parts DCP2 disposed in the first reference region SA1. In an exemplary embodiment, the first value may be 2×TD1.

A total sum of distances of gaps GAP disposed in the second region SA2, the distance being parallel to the first direction DR1, is defined as a "second value". The gap GAP may be defined as the gap between the first and second pattern parts PP1 and PP2 which have a minimum separation distance. In FIG. 3, the gap GAP may be defined between the second line LN2 and the fourth line LN4 and between the second pattern line PLN2 and the fourth pattern line PLN4. In an exemplary embodiment, the second value may be 2×MD. The MD may be a distance of the gap GAP parallel to the first direction DR1 and may correspond to a minimum separation distance between the first and second pattern parts PP1 and PP2.

The difference between the first and second values may be less than the second value. For example, the first value is greater than 0 and less than 2 times the second value. That is, the first and second values may satisfy following Equation 1.

$$|\text{first value} - \text{second value}| < \text{second value} \quad [0001] \quad \text{[Equation 1]}$$

In an exemplary embodiment, an example in which the first and second values are substantially the same is illustrated. In this case, the difference between the reflectivity of the first pattern part PP1 and the reflectivity of the boundary BL may be minimized. Accordingly, the boundary BL may be prevented from being viewed by a user. The above description may also be applied the same to the second pattern part PP2. Accordingly, the difference between the reflectivity of the second pattern part PP2 and the reflectivity of the boundary BL may be minimized.

The number of the second cut line parts disposed in the first reference region SA1 among the second cut line parts DCP2 may be the same as the number of gaps GAP disposed in the second reference region SA2. In this case, the first width TD1 of each of the second cut line parts DCP2 parallel to the first direction DR1 may be substantially the same as the distance of the gap GAP parallel to the first direction DR1. For example, when the minimum separation distance MD of the gap GAP is assumed to be about 3 μm, the first width TD1 may be about 3 μm.

In FIG. 3, although the boundary BL extending in the second direction DR2 is enlarged only for the purpose of description, the above description may also be applied the same to a boundary (not shown) extending in the first direction DR1.

In order to reduce the difference in reflectivity between the boundary BL extending in the second direction DR2, the first pattern part PP1, and the second pattern part PP2, the first cut line parts DCP1 may be defined inside the first pattern part PP1, and the third cut line parts DCP3 may be defined inside the second pattern part PP2.

The first line LN1 and the second line LN2, which are inside the first pattern part PP1, may be electrically connected to each other, and the third line LN3 and the fourth line LN4, which are inside the second pattern part PP2, may be electrically connected to each other. Accordingly, each of the first and second pattern parts PP1 and PP2 may receive signals by the entire region thereof through lines in which cut line parts are not provided. As a result, even when cut line parts are provided to the inside of each of the first and second pattern parts PP1 and PP2, the function as a sensor may not be lost.

Figure 4:
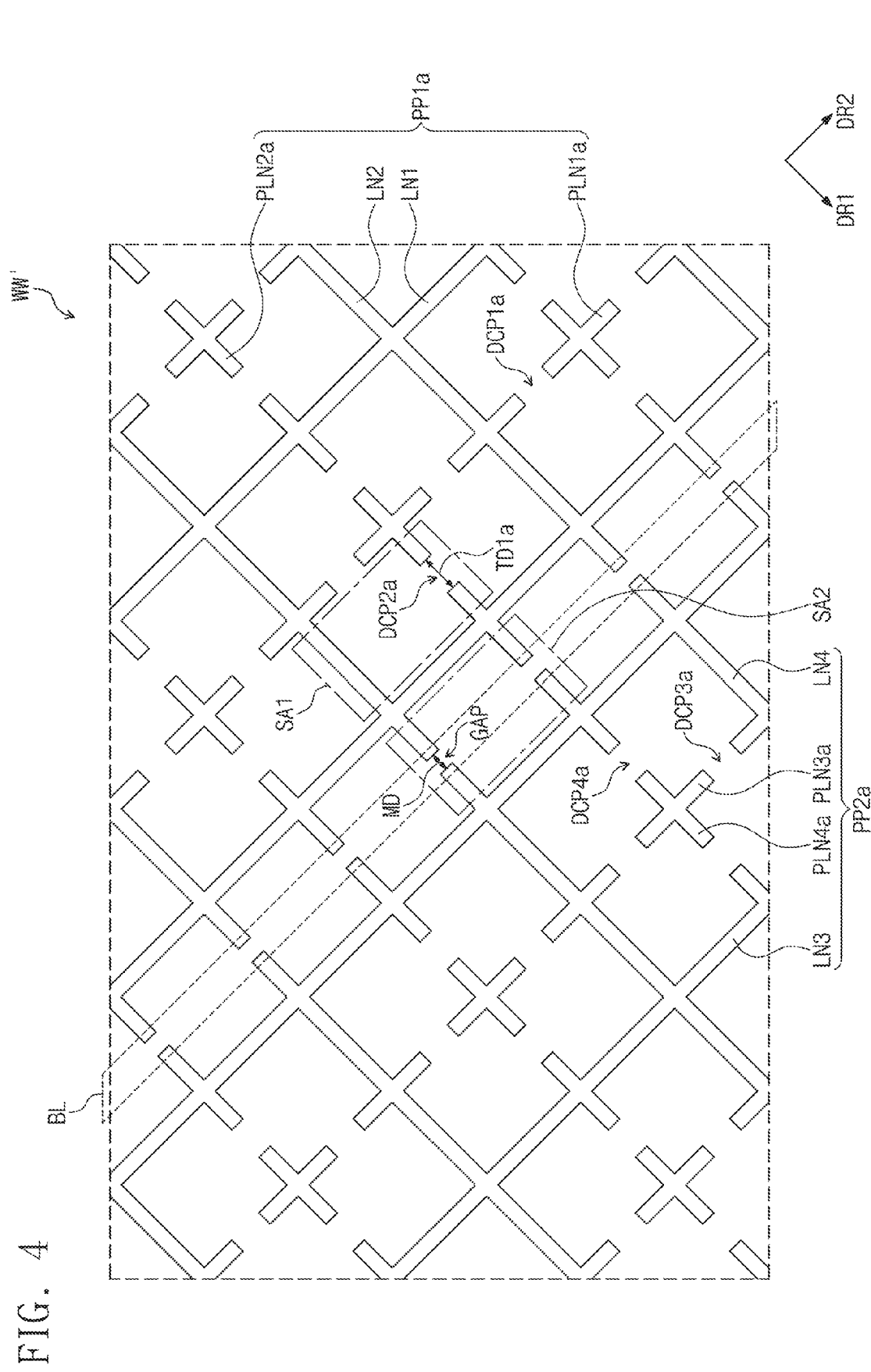
FIG. 4 is an enlarged plan view illustrating region WW' illustrated in FIG. 2.

FIG. 4 is an enlarged plan view illustrating region WW' illustrated in FIG. 2. In describing FIG. 4, like reference numerals denote like elements in the same configuration as those illustrated in FIG. 3, and overlapping descriptions thereof will not be provided.

Referring to FIG. 4, to prevent the boundary BL from being viewed due to a difference between reflectivity each of first and second pattern parts PP1a and PP2a and reflectivity of a boundary BL, cut line parts DCP1a, DCP2a, DCP3a, and DCP4a may be provided inside each of the first and second pattern parts PP1a and PP2a.

The first pattern part PP1a may include a first line LN1, a second line LN2, a first pattern line PLN1a, and a second pattern line PLN2a. The first cut line parts DCP1a may be defined in the first pattern line PLN1a, and the second cut line parts DCP2a may be defined in the second pattern line PLN2a.

The second pattern part PP2a may include a third line LN3, a fourth line LN4, a third pattern line PLN3a, and a fourth pattern line PLN4a. The third cut line parts DCP3a may be defined in the third pattern line PLN3a, and the fourth cut line parts DCP4a may be defined in the fourth pattern line PLN4a.

In an exemplary embodiment, the number of second cut line parts DCP2a disposed in a first reference region SA1 among the second cut line parts DCP2a may be different from the number of gaps GAP disposed in a second reference region SA2. For example, the is number of second cut line parts DCP2a may be less than the number of gaps GAP. However, the inventive concept is not limited thereto. In this case, the first width TD1a of each of the second cut line parts DCP2a parallel to the first direction DR1 may be greater than the distance of the gap GAP parallel to the first direction DR1. For example, when the minimum separation distance MD of the gap GAP is assumed to be 3 the first width TD1a may be 6 μm.

Figure 5:
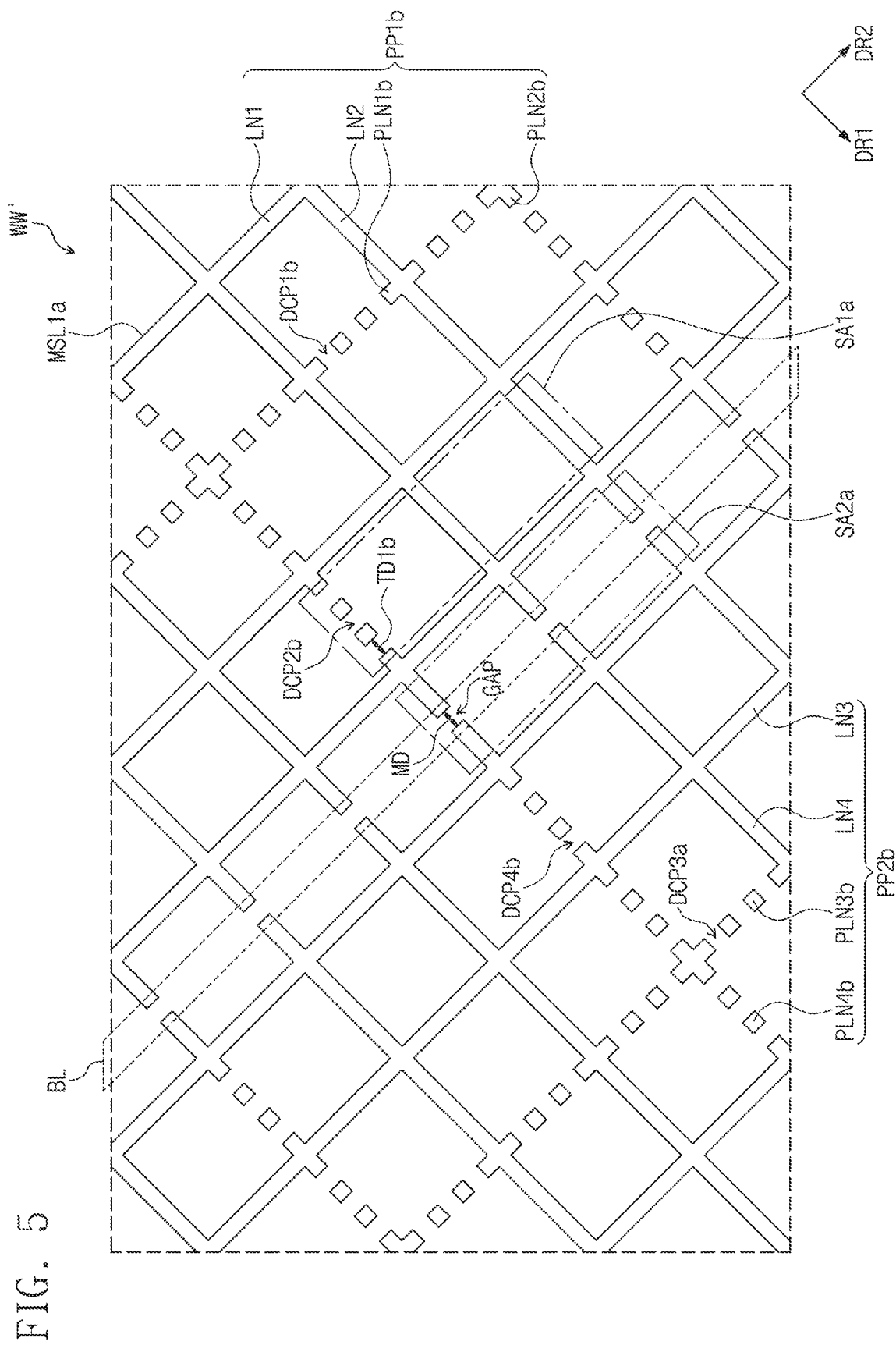
FIG. 5 is an enlarged plan view illustrating region WW' illustrated in FIG. 2.

FIG. 5 is an enlarged plan view illustrating region WW' illustrated in FIG. 2. In describing FIG. 5, like reference numerals denote like elements in the same configuration as those illustrated in FIG. 5, and overlapping descriptions thereof will not be provided.

Referring to FIG. 5, a first pattern part PP1b may include a first line LN1, a second line LN2, a first pattern line PLN1b, and a second pattern line PLN2b. The first cut line parts DCP1b may be defined in the first pattern line PLN1b, and the second cut line parts DCP2b may be defined in the second pattern line PLN2b.

A second pattern part PP2b may include a third line LN3, a fourth line LN4, a third pattern line PLN3b, and a fourth pattern line PLN4b. The third cut line parts DCP3b may be defined in the third pattern line PLN3b, and the fourth cut line parts DCP4b may be defined in the fourth pattern line PLN4b.

In an exemplary embodiment, two first lines LN1 and one first pattern line PLN1b may be alternately arrayed in a first direction DR1, and two second lines LN2 and one second pattern line PLN2b may be alternately arrayed in a second direction DR2. Also, two third lines LN3 and one third pattern line PLN3b may be alternately arrayed in the first direction DR1, and two fourth lines LN4 and one fourth pattern line PLN4b may be alternately arrayed in the second direction DR2.

A first reference region SA1a is defined in the first pattern part PP1b, and a is second reference region SA2a overlapping both the first and second pattern parts PP1b and PP2b is defined. The first and second reference regions SA1a and SA2a may have the same area. When the first reference region SA1a is moved in the first direction DR1, the first reference region SA1a may completely overlap the second reference region SA2a.

Mesh lines extending in the second direction DR2 among the first mesh lines MSL1a may not be disposed in the first reference region SA1a. A portion of a configuration repeating unit, which is a minimum repeating unit of the mesh lines extending in the first direction DR1 among the first mesh lines MSL1a, may be disposed in the first reference region SA1a.

In an exemplary embodiment, two second lines LN2 and one second pattern line PLN2b may be repeatedly arrayed in the second direction DR2. Accordingly, the configuration repeating unit may be the two second lines LN2 and the one second pattern line PLN2b. That is, in the first reference region SA1a, a portion of each of the two second lines LN2 and the one second pattern line PLN2b may be disposed.

A width of each of the second cut line parts DCP2b, the width being parallel to the first direction DR1, is defined as a first width TD1b. One or more second cut line parts may be disposed in the first reference region SA1a. In this case, a "first value" may be defined as a value which is the first width TD1b multiplied by the number of the second cut line parts disposed in the first reference region SA1a. In an exemplary embodiment, the first value may be 3×TD1b.

A total sum of distances of gaps GAP disposed in the second region SA2a, the distance being parallel to the first direction DR1, is defined as a "second value". The gap GAP may be defined as the gap between the first and second pattern parts PP1b and PP2b which have is a minimum separation distance. In an exemplary embodiment, the second value may be 3×MD. The MD may be a distance of the gap GAP parallel to the first direction DR1 and may correspond to a minimum separation distance between the first and second pattern parts PP1b and PP2b.

In an exemplary embodiment, an example in which the first and second values are substantially the same is illustrated. In this case, the difference between the reflectivity of each of the first and second pattern parts PP1b and PP2b and the reflectivity of the boundary BL may be minimized. Accordingly, the boundary BL may be prevented from being viewed by a user.

The number of the second cut line parts DCP2b disposed in the first reference region SA1a among the second cut line parts DCP2b may be the same as the number of the gaps GAP disposed in the second reference region SA2a. In this case, the first width TD1b of each of the second cut line parts DCP2b may be substantially the same as the distance of the gap GAP parallel to the first direction DR1. For example, when the minimum separation distance MD of the gap GAP is assumed to be about 3 μm, the first width TD1b may be about 3 μm.

Figure 6:
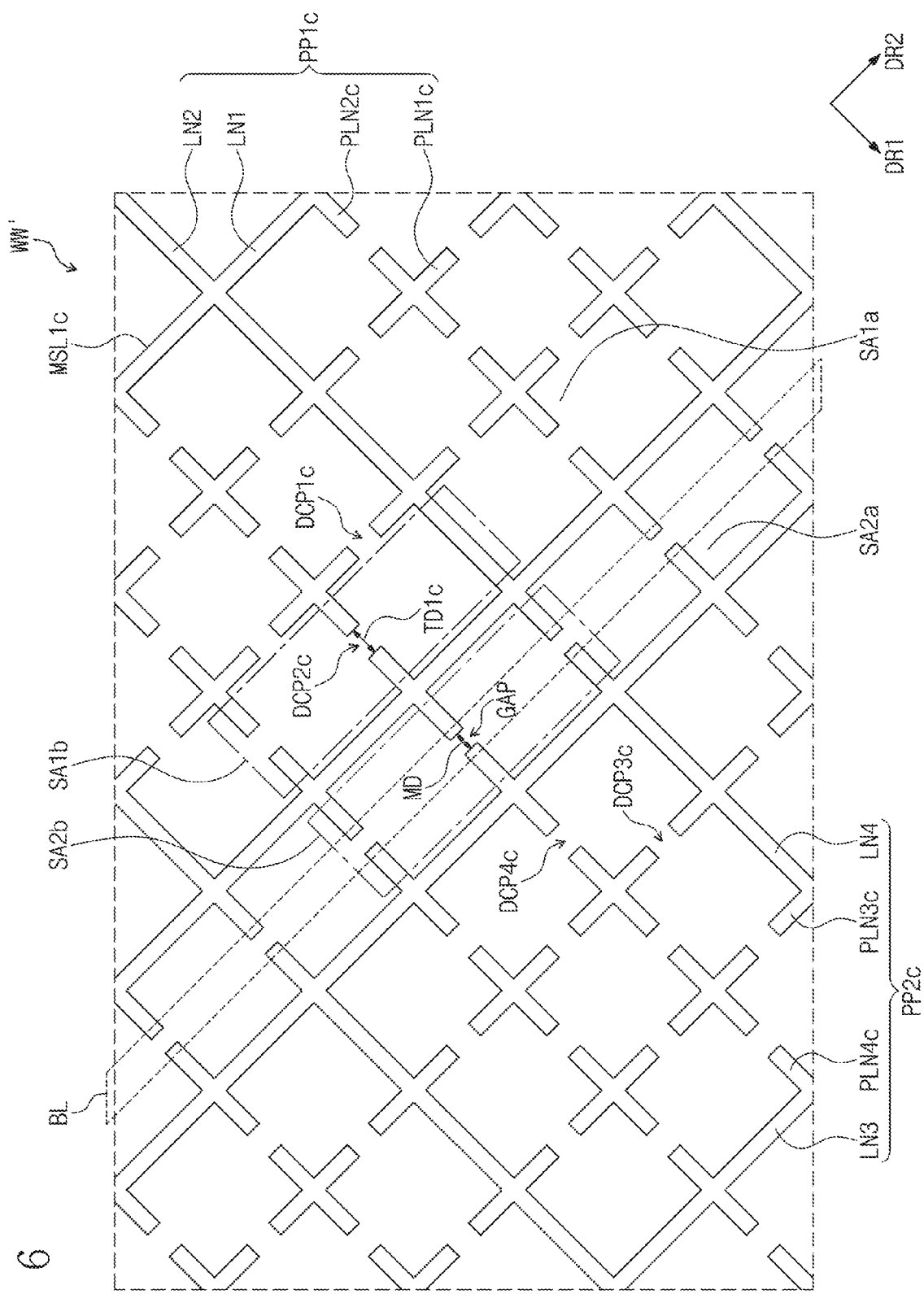
FIG. 6 is an enlarged plan view illustrating region WW' illustrated in FIG. 2.

FIG. 6 is an enlarged plan view illustrating region WW' illustrated in FIG. 2. In describing FIG. 6, like reference numerals denote like elements in the same configuration as those illustrated in FIG. 3, and overlapping descriptions thereof will not be provided.

Referring to FIG. 6, a first pattern part PP1c may include a first line LN1, a second line LN2, a first pattern line PLN1c, and a second pattern line PLN2c. First cut line parts DCP1c may be defined in the first pattern line PLN1c, and second cut line parts DCP2c may be defined in the second pattern line PLN2c.

The second pattern part PP2c may include a third line LN3, a fourth line LN4, a third pattern line PLN3c, and a fourth pattern line PLN4c. The third cut line parts DCP3c may is be defined in the third pattern line PLN3c, and the fourth cut line parts DCP4c may be defined in the fourth pattern line PLN4c.

In an exemplary embodiment, one first line LN1 and two first pattern lines PLN1c may be alternately arrayed in a first direction DR1, and one second line LN2 and two second pattern lines PLN2c may be alternately arrayed in a second direction DR2. Also, one third line LN3 and two third pattern lines PLN3c may be alternately arrayed in the first direction DR1, and one fourth line LN4 and two fourth pattern lines PLN4c may be alternately arrayed in the second direction DR2.

Mesh lines extending in the second direction DR2 among the first mesh lines MSL1c may not be disposed in the first reference region SA1b, and a portion of a configuration repeating unit which is a minimum repeating unit of the mesh lines extending in the first direction DR1 among the first mesh lines MSL1c may be disposed in the first reference region SA1b.

In an exemplary embodiment, two second pattern lines PLN2c and one second line LN2 may be repeatedly arrayed in the second direction DR2. Accordingly, the configuration repeating unit may be the two second pattern lines PLN2c and one second line LN2. That is, in the first reference region SA1a, a portion of each of the two second lines LN2 and the one second pattern line PLN2c may be disposed.

A width of each of the second cut line parts DCP2c, the width being parallel to the first direction DR1, is defined as a first width TD1c. One or more second cut line parts may be disposed in the first reference region SA1b. A "first value" may be defined as a value which is the first width TD1c multiplied by the number of the second cut line parts disposed in the first reference region SA1b. In the current embodiment, the first value may be 2×TD1c.

A total sum of distances of gaps GAP disposed in the second region SA2b, the distance being parallel to the first direction DR1, is defined as a "second value". The gap GAP may be defined as the gap between the first and second pattern parts PP1c and PP2c, which have a minimum separation distance. In an exemplary embodiment, the second value may be 3×MD.

The first and second values may be equal. In this case, when the minimum separation distance MD of the gap GAP is assumed to be about 3 the first width TD1c may be about 4.5 μm. However, the inventive concept is not limited thereto. For example, the first value may be greater than 0 and less than 2 times the second value.

Figure 7:
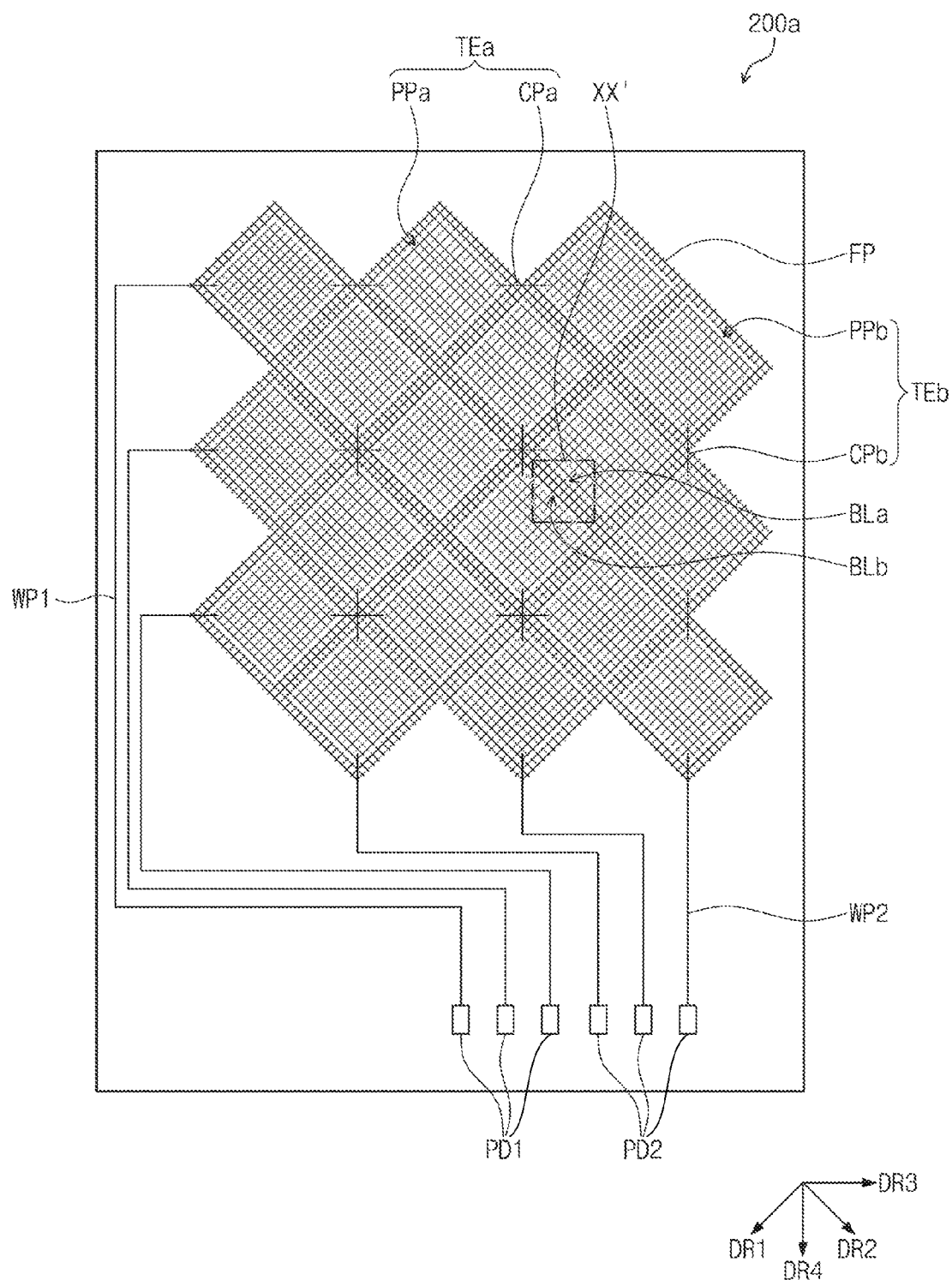
FIG. 7 is a plan view illustrating a partial configuration of the electronic device illustrated in FIG. 1.

FIG. 7 is a plan view illustrating a partial configuration of the electronic device illustrated in FIG. 1. In describing FIG. 7, like reference numerals denote like elements in the same configuration as those illustrated in FIG. 2, and overlapping descriptions thereof will not be provided.

Referring to FIG. 7, a touch sensing unit 200a may include a plurality of first electrodes TEa, a plurality of second electrodes TEb, a second pattern part FP, a plurality of first lines WP1, a plurality of second lines WP2, a plurality of first pads PD1, and a plurality of second pads PD2.

FIG. 7 differs from FIG. 2 in that a second pattern part FP not included in FIG. 2 is further included in FIG. 7. The second pattern part FP may be an electrically separated floating pattern. The second pattern part FP may be spaced apart from each of the first electrodes TEa and the second electrodes TEb with boundaries BLa and BLb disposed therebetween.

Since the second pattern part FP is electrically separated from the surroundings, noise that may be caused by mutual interaction between electrical signals transmitted to the first and second electrodes TEa and TEb by the second pattern part FP and electrical signals transmitted to pixel electrodes disposed under the first and second electrodes TEa and TEb, may be reduced.

The shapes of the first electrodes TEa may be substantially the same as the shapes of the first electrodes TE1 in FIG. 2, and the shapes of the second electrodes TEb may be substantially the same as the shapes of the second electrodes TE2 in FIG. 2. That is, in comparison with the first and second electrodes TE1 and TE2 in FIG. 2, the first and second electrodes TEa and TEb may have substantially the same shape, and differ only in size. Thus, the specific description with regard to this will not be provided.

The first electrodes TEa each may include a plurality of first pattern parts PPa and a plurality of first connecting parts CPa, which are arrayed in a third direction DR3. The second electrodes TEb each may include a plurality of third pattern parts PPb and a plurality of second connecting parts CPb which are arrayed in a fourth direction DR4.

According to an exemplary embodiment, a plurality of cut line parts may be provided by cutting a portion of each of the first to third pattern parts PPa, FP, and PPb. Accordingly, a boundary BLa between the first pattern part PPa and the second pattern part FP and a boundary BLb between the second pattern part FP and the third pattern part PPb may be prevented from being viewed. This will be described in FIGS. 8 and 9.

Figure 8:
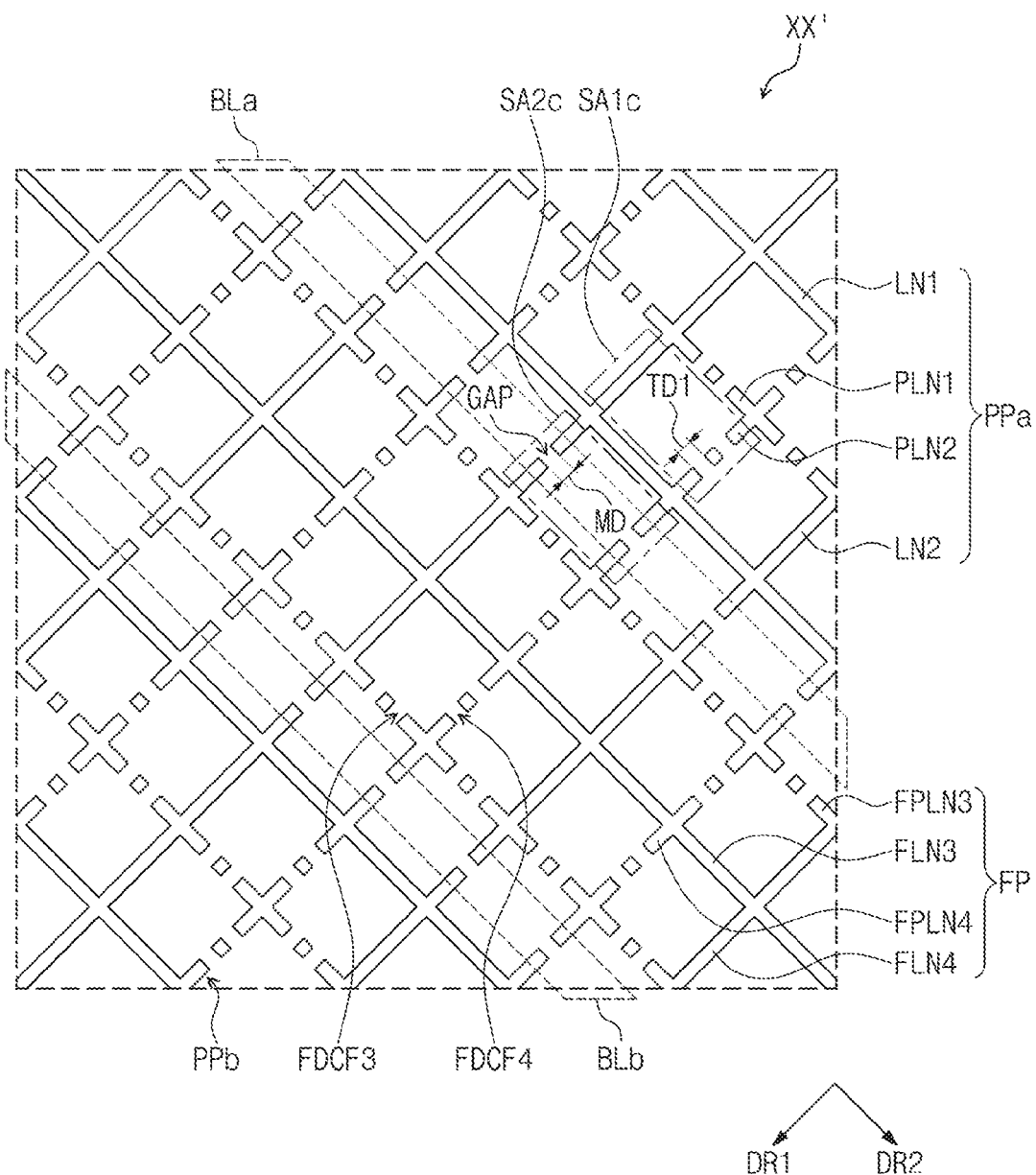
FIG. 8 is an enlarged plan view illustrating region XX' illustrated in FIG. 7.

FIG. 8 is an enlarged plan view illustrating region XX' illustrated in FIG. 7. In describing FIG. 8, like reference numerals denote like elements in the same configuration as those illustrated in FIG. 3, and overlapping descriptions thereof will not be provided.

Referring to FIGS. 7 and 8, the first pattern part PPa in FIG. 7 may include mesh lines which have substantially the same shapes as those in the first pattern part PP1 of FIG. 2, and the third pattern part PPb may include mesh lines which are substantially the same as those in the second pattern part PP2 of FIG. 2. However, the inventive concept is not limited thereto. For example, each of the first and third pattern parts PPa and PPb may include mesh lines having the same shapes as any one of the first pattern parts and any one of the second pattern parts which are illustrated in FIGS. 3 to 6 described above. Accordingly, specific descriptions with regard to the first and third pattern parts PPa and PPb will not be provided.

The second pattern part FP may include a third line FLN3, a third pattern line FPLN3, a fourth line FLN4, and a fourth pattern line FPLN4. The third line FLN3 and the third pattern line FPLN3 may be arrayed in the first direction DR1, and the fourth line FLN4 and the fourth pattern line FPLN4 may be arrayed in the second direction DR2.

Third cut line parts FDCF3 may be defined in the third pattern line FPLN3, and fourth cut line parts FDCF4 may be defined in the fourth pattern line FPLN4. That is, the floated second pattern part FP may include a plurality of cut line parts.

The second pattern part FP may include mesh lines having shapes substantially the same as each of the first pattern part PPa and the third pattern part PPb. Accordingly, a difference between reflectivity of each of the first pattern part PPa, the second pattern part FP, and the third pattern part PPb and reflectivity of each of the boundaries BLa and BLb may be minimized. Accordingly, the boundaries BLa and BLb may be prevented from being viewed by to a user.

A first reference region SA1c is defined in the first pattern part PPa, and a second reference region SA2c overlapping both the first and second pattern parts PPa and FP is defined.

The first and second reference regions SA1c and SA2c may have the same area. The width of the first reference regions SA1c in the second direction DR2 may be the same as is the width of the second reference regions SA2c in the second direction DR2.

One or more second cut line parts may be disposed in the first reference region SA1c. In this case, a "first value" may be defined as a value which is a first width TD1 of the second cut line part multiplied by the number of the second cut line parts disposed in the first reference region SA1c. In an exemplary embodiment, the first value may be 2×TD1.

A total sum of distances of gaps GAP disposed in the second region SA2c, the distance being parallel to the first direction DR1, is defined as a "second value". The gap GAP may be defined as the gap between the first and second pattern parts PPa and FP which have a minimum separation distance. In an exemplary embodiment, the second value may be 2×MD. The MD may be a distance of the gap GAP parallel to the first direction DR1 and may correspond to a minimum separation distance between the first and second pattern parts PPa and FP.

The difference between the first and second values may be less than the second value. For example, the first value may be greater than 0 and less than 2 times the second value. As a result, a difference between reflectivity of each of the first pattern part PPa, the second pattern part FP, and the third pattern part PPb and reflectivity of each of the boundaries BLa and BLb may be minimized. As a result, the boundaries BLa and BLb may be prevented from being viewed due to the reflection of the external light.

Figure 9:
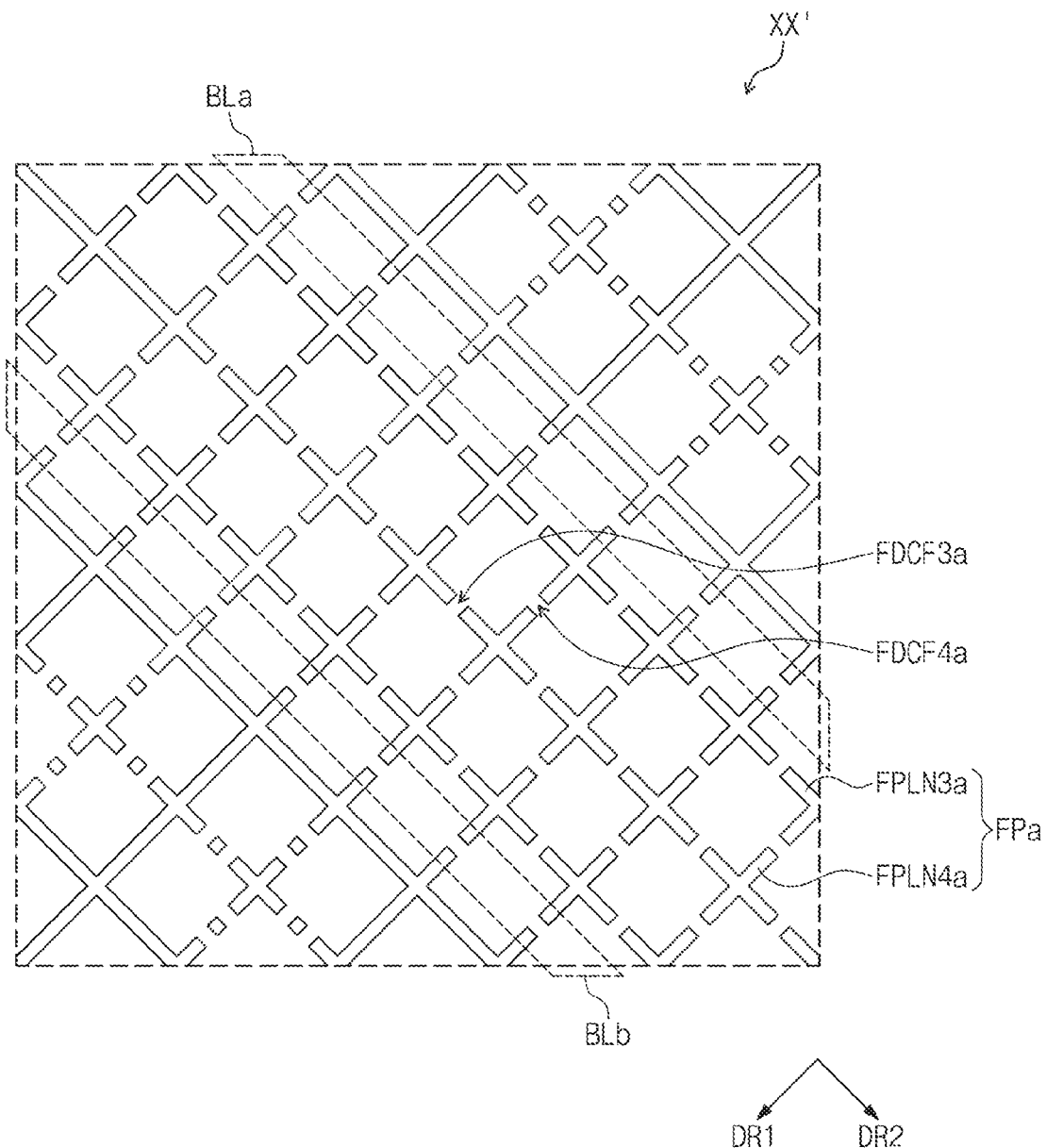
FIG. 9 is an enlarged plan view illustrating region XX' illustrated in FIG. 7.

FIG. 9 is an enlarged plan view illustrating region WW' illustrated in FIG. 7. In describing FIG. 9, like reference numerals denote like elements in the same configuration as those illustrated in FIGS. 3 and 8, and overlapping descriptions thereof will not be provided.

Referring to FIGS. 7 and 9, a second pattern part FPa may include a third pattern line FPLN3a and a fourth pattern line FPLN4a. Third cut line parts FDCF3a may be defined in is the third pattern line FPLN3a, and fourth cut line parts FDCF4a may be defined in the fourth pattern line FPLN4a.

The second pattern part FPa of FIG. 9 may not include a third line (FLN3 of FIG. 8) and a fourth line (FLN4 of FIG. 8), which do not include a cut line part. In other words, the second pattern part FPa of FIG. 9 may have the same form as a form in which cut line parts are also provided to both the third line (FLN3 of FIG. 8) and the fourth line (FLN4 of FIG. 8). Since the second pattern part FPa is an electrically separated floating pattern, all mesh lines may include cut line parts.

Figure 10:
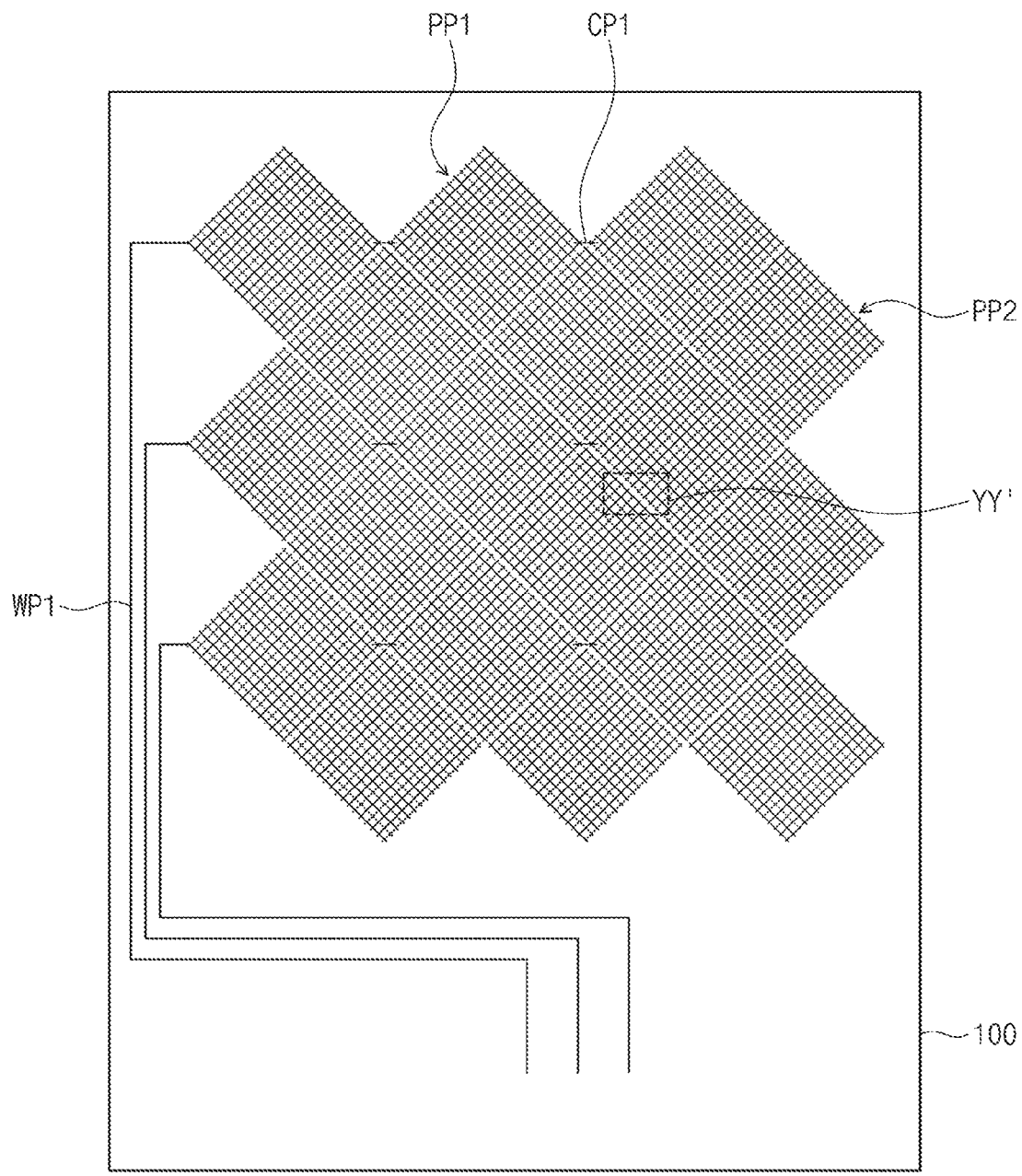
FIG. 10 and FIG. 11 are plan views respectively illustrating partial configurations of the electronic device illustrated in FIG. 1.
Figure 11:
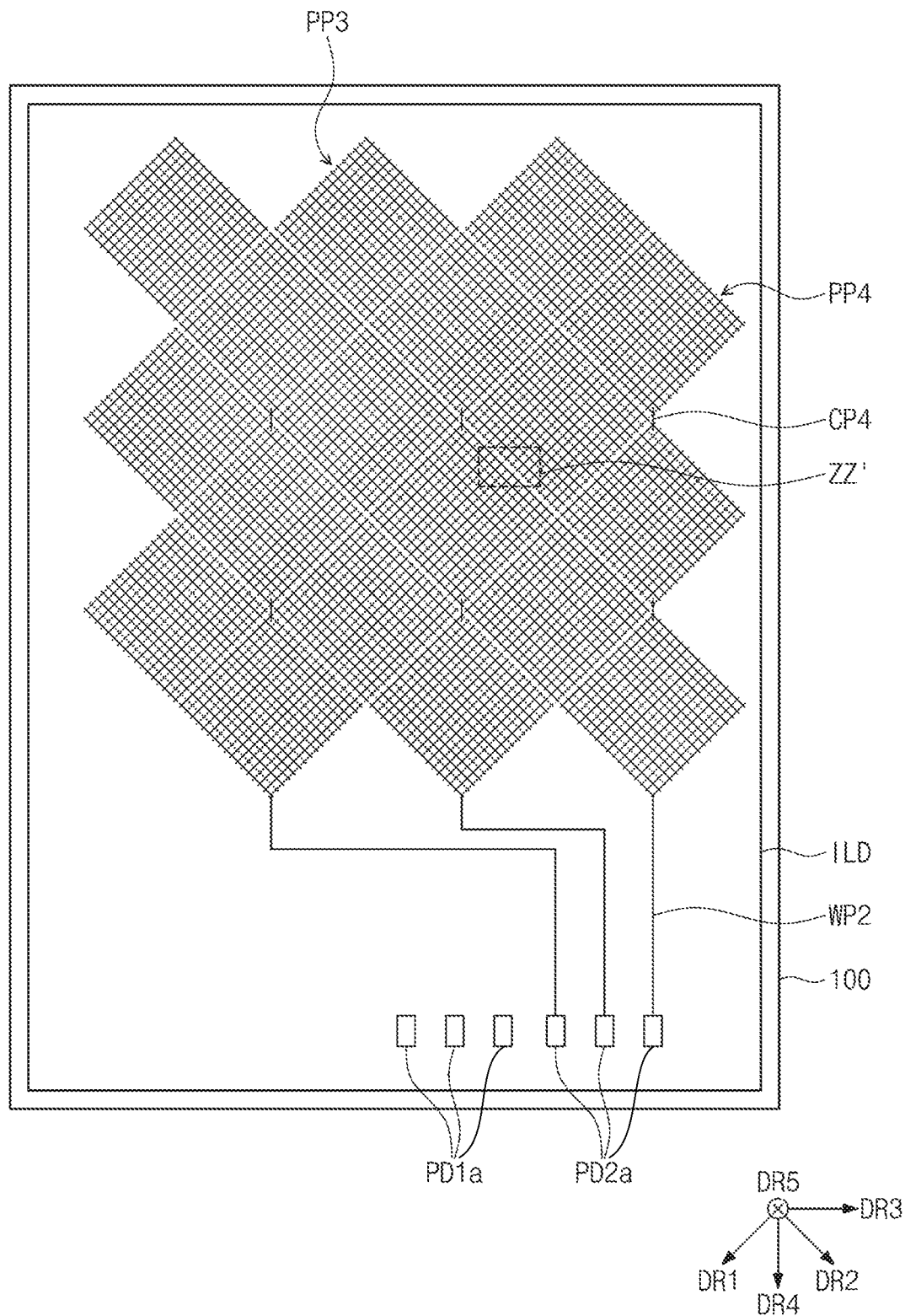

FIGS. 10 and 11 are plan views respectively illustrating partial configurations of the electronic device illustrated in FIG. 1.

Referring to FIGS. 10 and 11, a first pattern part PP1, a second pattern part PP2, a first connecting part CP1, and a first lines WP1 may be disposed on a base layer 100.

An insulating layer ILD may be disposed on the base layer 100. The insulating layer ILD may cover the first pattern part PP1, the second pattern part PP2, and the first connecting part CP1. The insulating layer ILD includes an insulating material. For example, the insulating layer ILD may include an organic and/or an inorganic material.

On the insulating layer ILD, a third pattern part PP3, a fourth pattern part PP4, a second connecting part CP4, second lines WP2, first pads PD1a, and second pads PD2a may be disposed. The first pads PD1a may be electrically connected to the first lines WP1 through contact holes (not shown).

When viewed in a plan view, the first pattern part PP1 and the third pattern part PP3 overlap each other, and the second pattern part PP2 and the fourth pattern part PP4 may overlap each other. The wording "when viewed in a plan view" means "when viewed from a is direction parallel to the thickness direction DR5 of the base layer 100".

The first pattern part PP1 and the third pattern part PP3 may constitute a first electrode, and the second pattern part PP2 and the fourth pattern part PP4 may constitute a second electrode. In this case, the first and second electrodes each have a multi-layer structure. Accordingly, since the first through fourth pattern parts PP1, PP2, PP3, PP4 each have a relatively low resistance, the first and second electrodes may have a higher electrical conductivity than in the case of a single-layer structure.

Figure 12:
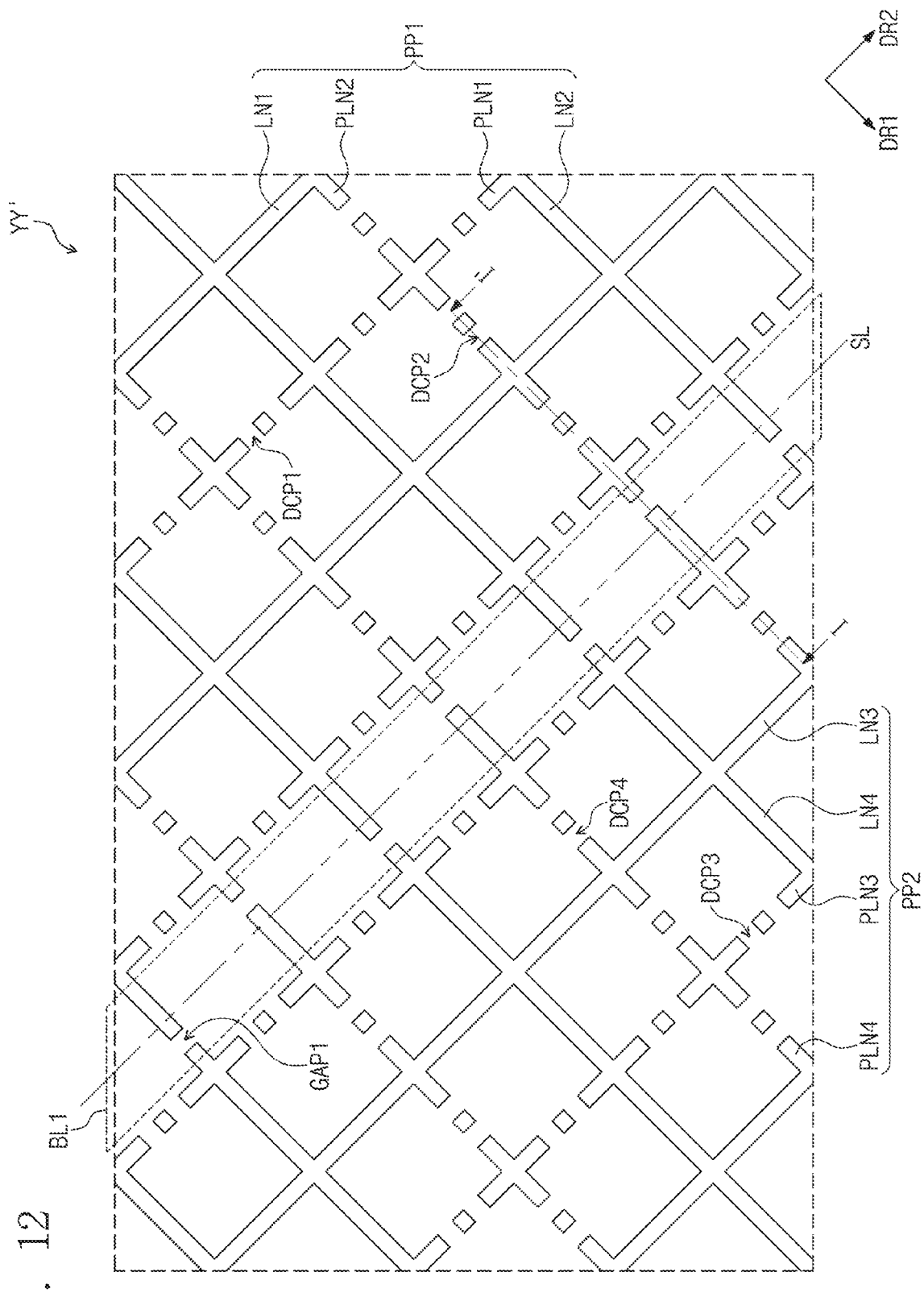
FIG. 12 is an enlarged plan view illustrating region YY' illustrated in FIG. 10.
Figure 13:
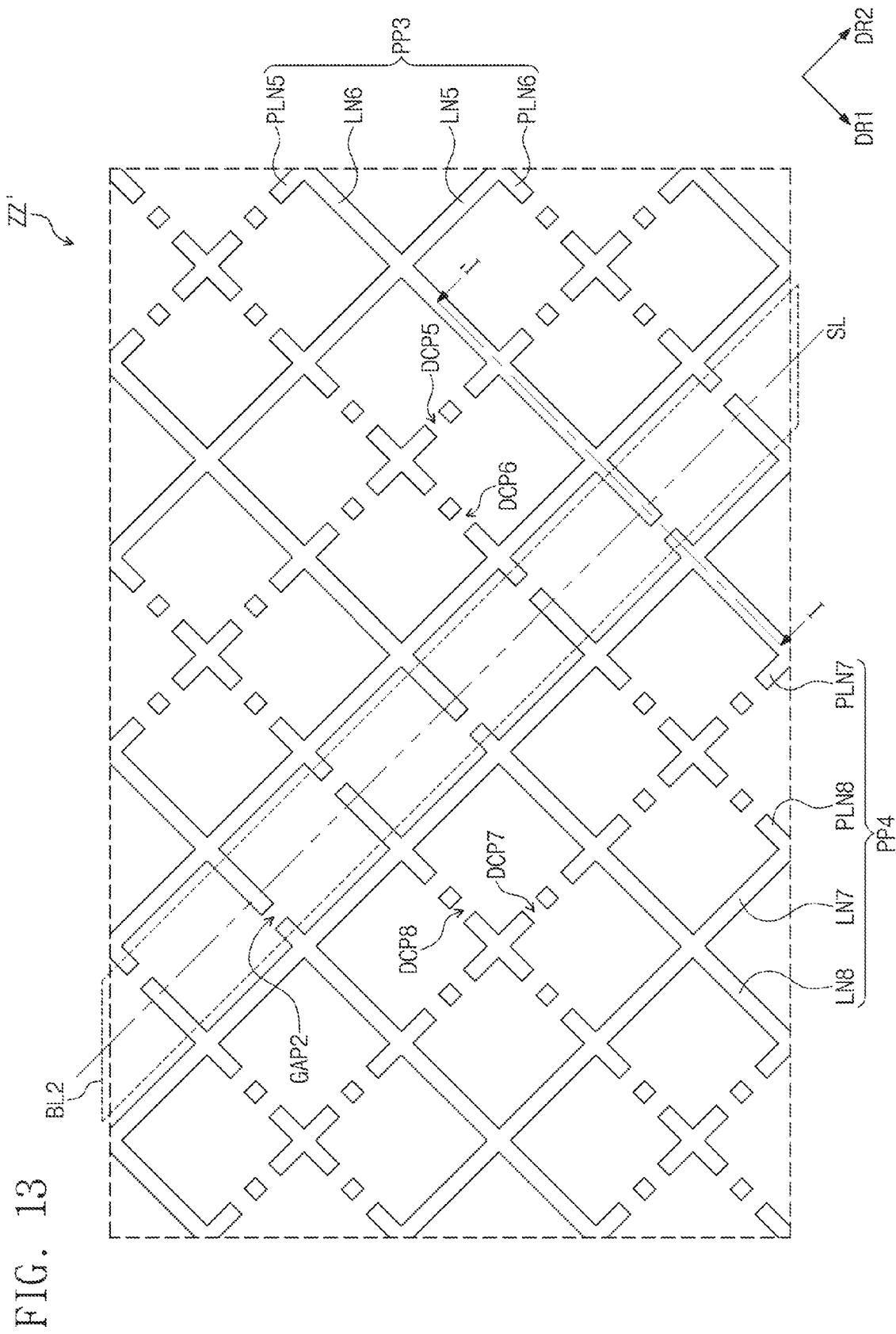
FIG. 13 is an enlarged plan view illustrating region ZZ' illustrated in FIG. 11.

FIG. 12 is an enlarged plan view illustrating region YY' illustrated in FIG. 10, and FIG. 13 is an enlarged plan view illustrating region ZZ' illustrated in FIG. 11. Region YY' of FIG. 12 and region ZZ' of FIG. 13 overlap each other when viewed in a plan view. In describing FIGS. 12 and 13, like reference numerals denote like elements in the same configuration as those illustrated in FIGS. 3 and 8, and overlapping descriptions thereof will not be provided.

Referring to FIG. 12, a first pattern part PP1 and a second pattern parts PP2 may have shapes similar to mesh lines included in the first pattern part PP1 and the second pattern part PP2 illustrated in FIG. 3. Thus, the description regarding this will not be provided.

Comparing FIG. 12 with FIG. 3, there is a difference in the position of a gap GAP1 disposed on a boundary BL1 between the first and second pattern part PP1 and PP2. The gap GAP1 may be disposed to be spaced apart in a first direction DR1 or in a reverse direction of the first direction DR1 with respect to a reference line SL extending in a second direction DR2. That is, when gaps GAP1 adjacent to each other are connected by a straight line, a zigzagged line traveling in the second direction DR2 may be drawn.

Referring to FIG. 13, a third pattern part PP3 and a fourth pattern part PP4 may is respectively have shapes similar to those of the first pattern part PP1 and the second pattern part PP2 illustrated in FIG. 12. This will be more specifically described below.

The third pattern part PP3 may include a fifth line LN5, a sixth line LN6, a fifth pattern line PLN5, and a sixth pattern line PLN6. Cut line parts may not be defined in the fifth and sixth lines LN5 and LN6, fifth cut line parts DCP5 may be defined in the fifth pattern line PLN5, and sixth cut line parts DCP6 may be defined in the sixth pattern lines PLN6.

The fourth pattern part PP4 may include a seventh line LN7, an eighth line LN8, a seventh pattern line PLN7, and an eighth pattern line PLN8. Cut line parts may not be defined in the seventh and eighth lines LN7 and LN8, seventh cut line parts DCP7 may be defined in the seventh pattern line PLN7, and eighth cut line parts DCP8 may be defined in the eighth pattern lines PLN8.

The third pattern part PP3 and a fourth pattern part PP4 may have shapes similar to the mesh lines included in the first pattern part PP1 and the second pattern part PP2 illustrated in FIG. 3. Thus, the description regarding this will not be provided.

When FIGS. 12 and 13 are viewed in a plane in an overlapping manner, a gap GAP1 between the first and second pattern part PP1 and PP2 and a gap GAP2 between the third and fourth pattern part PP3 and PP4 may not overlap each other. Accordingly, when boundaries BL1 and BL2 overlap, portions in which mesh lines are all cut may not be visible when viewed in a plan view. In this case, when viewed in a plan view, the probability that gaps are viewed may be reduced in comparison with the case in which the gaps overlap.

The first pattern part PP1 overlap the third pattern part PP3 when viewed in a plan view. In this case, when viewed in a plan view, the first line LN1 may overlap the fifth pattern line PLN5, and the first pattern line PLN1 may overlap the fifth line LN5. Also, the second line is LN2 may overlap the sixth pattern line PLN6, and the second pattern line PLN2 may overlap the sixth line LN6.

Accordingly, when viewed in a plan view, the first and fifth cut line parts DCP1 and DCP5 may not overlap each other, and the second and sixth cut line parts DCP2 and DCP6 may not overlap each other.

The second pattern part PP2 and the fourth pattern part PP4 overlap each other when viewed in a plan view. In this case, when viewed in a plan view, the third line LN3 may overlap the seventh pattern line PLN7, and the third pattern line PLN3 may overlap the seventh line LN7. Also, the fourth line LN4 may overlap the eighth pattern line PLN8, and the fourth pattern line PLN4 may overlap the eighth line LN8.

Accordingly, when viewed in a plan view, the third and seventh cut line parts DCP3 and DCP7 may not overlap each other, and the fourth and eighth cut line parts DCP4 and DCP8 may not overlap each other.

FIG. 12 and FIG. 13 illustrate that the first to fourth pattern parts PP1, PP2, PP3, and PP4 have shapes similar to the first and second pattern parts PP1 and PP2 of FIG. 3, but the inventive concept is not limited thereto, and various mesh shapes described above may be applied to each of the first to fourth pattern parts PP1, PP2, PP3, and PP4.

Figure 14:
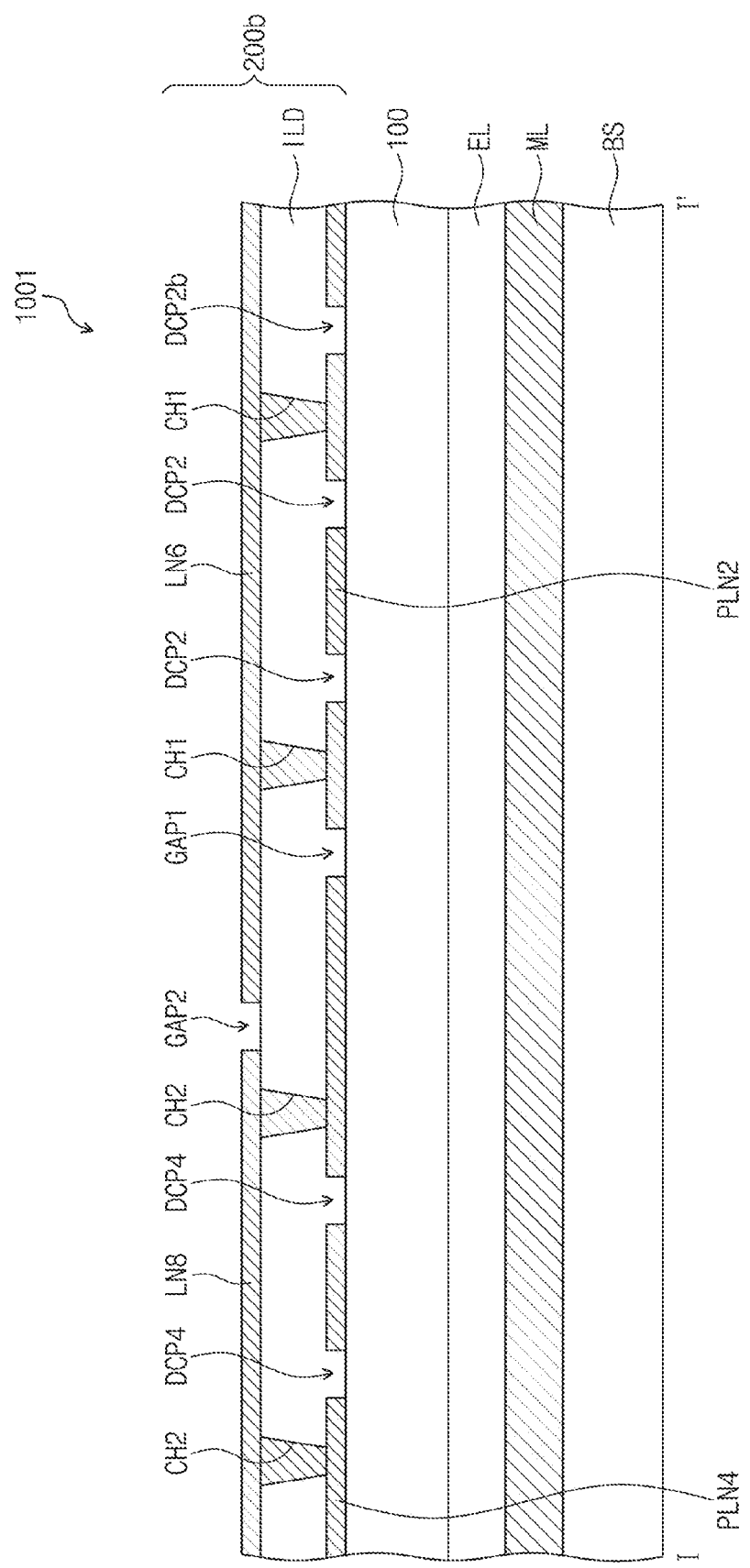
FIG. 14 is a cross-sectional view taken along line I-I' of FIG. 12 and FIG. 13.

FIG. 14 is a cross-sectional view taken along line I-I' of FIGS. 12 and 13. In describing FIG. 9, like reference numerals denote like elements in the same configuration as those illustrated in FIGS. 12 and 13, and overlapping descriptions thereof will not be provided.

Referring to FIGS. 12, 13, and 14, an exemplary embodiment is illustrated in which an electronic device 1001 is a display device.

The electronic device 1001 may be employed in various forms, such as an organic is light emitting display device, a liquid crystal device, a plasma display device, an electrophoretic display device, and an electro-wetting display device. In an exemplary embodiment, the display apparatus 1001 is an organic light emitting display apparatus is described as an example.

The electronic device 1001 may include a base substrate BS, a circuit layer ML, an organic light emitting element layer EL, a base layer 100, and a touch sensing unit 200*b*.

The base substrate BS may include at least any one of a glass substrate, a sapphire substrate, or a plastic substrate. The circuit layer ML, the organic light emitting element layer EL, the base layer 100, and the touch sensing unit 200*b* may be disposed on the base substrate BS.

The circuit layer ML may include a plurality of signal lines and electronic elements. For example, the circuit layer ML may include gate lines, data lines, and thin film transistors corresponding to each of pixels.

The organic light emitting element layer EL may generate light having colors corresponding to light emitting materials. The colors may include red, green, blue, and white, but the inventive concept is not limited thereto. The organic light emitting element layer EL may generate light with a predetermined color to display an image. Accordingly, the organic light emitting element layer EL may be referred to as a "display layer".

The base layer 100 may include a thin film encapsulation layers (TFE), that is, a plurality of inorganic thin films and a plurality of organic thin films. The base layer 100 covers the organic light emitting element layer EL and may protect the organic light emitting element layer EL by blocking air and water.

In an exemplary embodiment, a case in which the touch sensing unit 200*b* is disposed on the upper surface of the base layer 100 is illustrated as an example, but the inventive is concept is not limited thereto. For example, the touch sensing unit 200*b* may be disposed under the base layer 100 between the base layer 100 and the organic light emitting element layer EL.

In another exemplary embodiment, the base layer 100 may be replaced by a substrate. In this case, the base layer 100 is disposed to be spaced apart from the base substrate BS with the organic light emitting element layer EL disposed therebetween. The base layer 100 and the base substrate BS may be coupled to each other by means of a sealing agent disposed along the periphery of the base substrate BS. In this case, the touch sensing unit 200*b* may also be formed on the upper surface of the base layer 100 to be coupled to the base substrate BS, or may also be formed on the lower surface of the base layer 100 to be coupled to the base substrate BS.

First and third pattern parts PP1 and PP3 may be electrically connected to each other through first contact holes CH1 defined in an insulating layer ILD, and the second and fourth pattern parts PP2 and PP4 may be electrically connected to each other through second contact holes CH2 defined in the insulating layer ILD. Each of the first and second contact holes CH1 and CH2 may overlap a crossing point at which a plurality of mesh lines cross. However, the inventive concept is not limited thereto.

Figure 15:
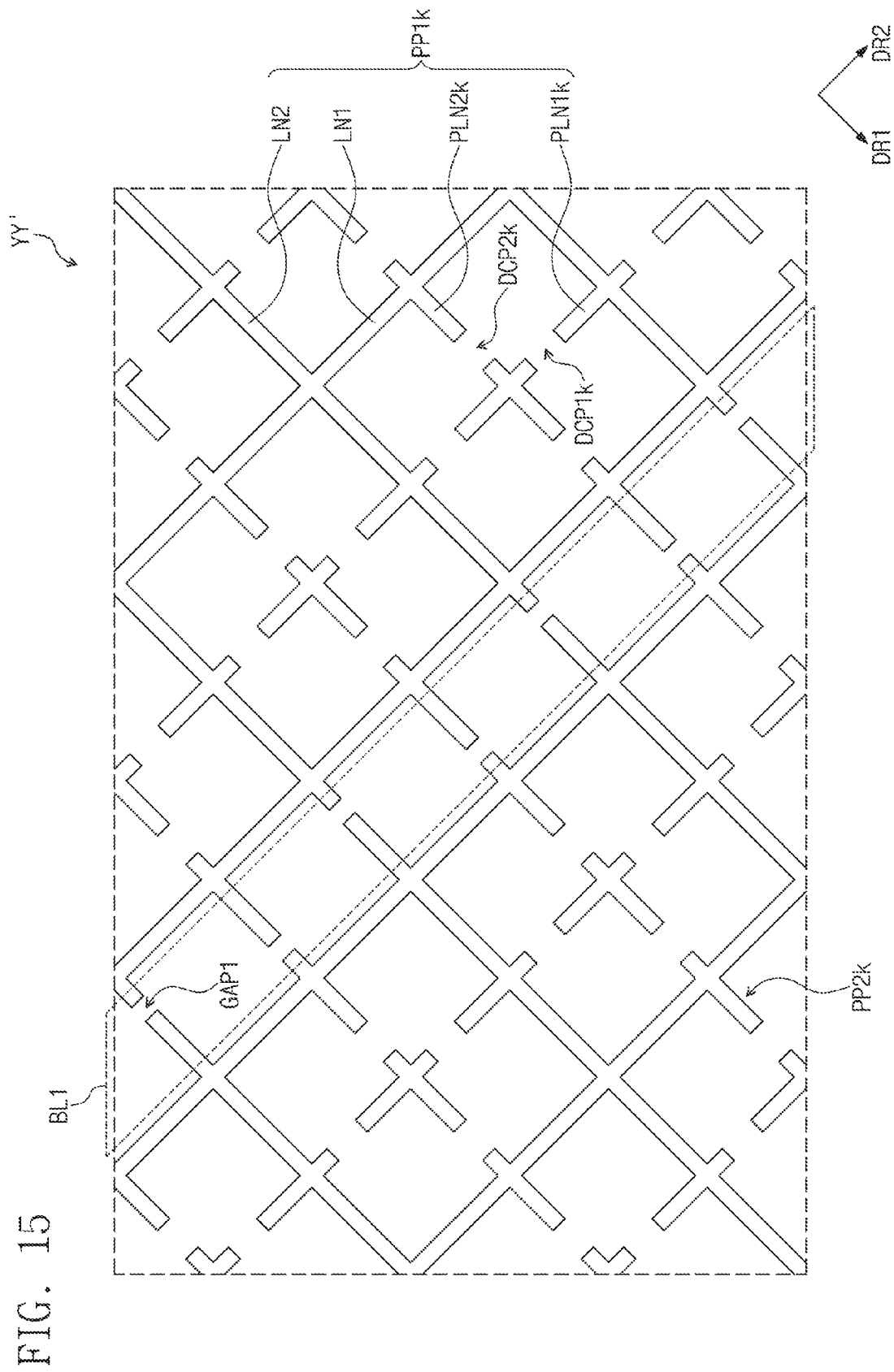
FIG. 15 is an enlarged plan view illustrating region YY' illustrated in FIG. 10.
Figure 16:
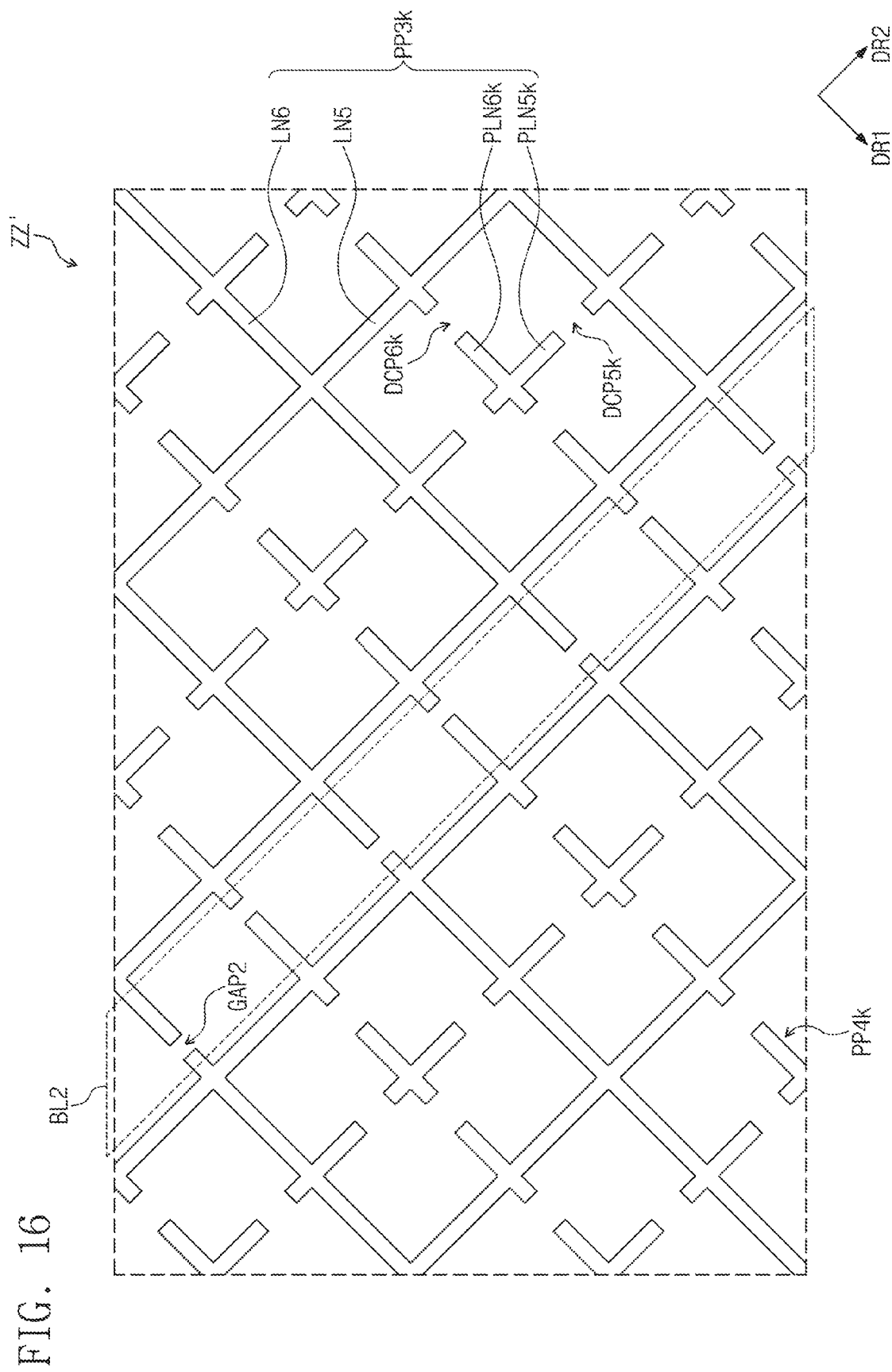
FIG. 16 is an enlarged plan view illustrating region ZZ' illustrated in FIG. 11.

FIG. 15 is an enlarged plan view illustrating region YY' illustrated in FIG. 10, and FIG. 16 is an enlarged plan view illustrating region ZZ' illustrated in FIG. 11. Region YY' of FIG. 15 and region ZZ' of FIG. 16 overlap each other when viewed in a plan view. In describing FIGS. 15 and 16, like reference numerals denote like elements in the same configuration as those illustrated in FIGS. 12 and 13, and overlapping descriptions thereof will not be provided.

In case of FIGS. 15 and 16, each of the first pattern part PP1*k*, a second pattern part PP2*k*, a third pattern part PP3*k*, and the fourth pattern part PP4*k* has a position different from each other but has a shape similar to those of the first and second pattern parts PP1*a* and PP2*a* described with reference to FIG. 4. Accordingly, cut line parts corresponding to vacant spaces between the pattern parts adjacent to each other may be defined in each of the first to fourth patterns PP1*k*, PP2*k*, PP3*k*, and PP4*k*.

When viewed in a plan view, the first line LN1 and the fifth line LN5 may overlap each other, and the first pattern line PLN1*k* and the fifth pattern line PLN5*k* may overlap each other. Also, when viewed in a plan view, a second line LN2 and the sixth line LN6 may overlap each other, and the second pattern line PLN2*k* and the sixth pattern line PLN6*k* may overlap each other.

However, the position of a first cut line parts DCP1*k* of the first pattern line PLN1*k* and the position of the fifth cut line parts DCP5*k* in the fifth pattern line PLN5*k* may not overlap each other. Also, the position of a second cut line parts DCP2*k* of the second pattern line PLN2*k* and the position of the sixth cut line parts DCP6*k* in the sixth pattern line PLN6*k* may not overlap each other.

According to the present disclosure, boundaries of patterns of a touch sensing unit may be prevented from being easily viewed by a user due to reflection of external light.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An electronic device comprising:
   a base layer;
   a first pattern part disposed on one surface of the base layer, the first pattern part comprising:
      first lines arrayed in a first direction, each of the first lines extending in a second direction crossing the first direction;
      a first pattern line which is disposed between the first lines and in which first cut line parts are defined;
      second lines disposed in the second direction, each of the second lines extending in the first direction;
      a second pattern line which is disposed between the second lines and in which second cut line parts are defined; and
   a second pattern part disposed on one surface of the base layer and spaced apart from the first pattern part in the first direction, the second pattern part comprising:
      third lines arrayed in the first direction, each of the third lines extending in the second direction; and
      fourth lines disposed in the second direction, each of the fourth lines extending in the first direction,
   wherein:
   a first reference region is defined in the first pattern part;
   a configuration repeating unit, which is a minimum repeating unit of the second lines and the second pattern line, which are arrayed in the second direction, is disposed in the first reference region;
   a second reference region, which overlaps the first and second pattern parts, is defined;
   the second reference region is spaced apart from the first reference region in the first direction and has a same area as the first reference region;
   a width of each of the second cut line parts in the first direction is defined as a first width; and
   a difference between a first value, which is number of second cut line parts disposed in the first reference region among the second cut line parts multiplied by the first width, and a second value, which is a total sum of a minimum spaced distance between the first and second pattern parts which are disposed in the second reference region, is less than the second value.

2. The electronic device of claim 1, wherein the first lines and the first pattern line are not disposed in the first reference region, and a width of the first reference region in the second direction is equal to a width of the second reference region in the second direction.

3. The electronic device of claim 1, wherein a portion of any one second line of two second lines adjacent to each other from among the second lines and a portion of the second pattern line disposed between the two adjacent second lines are disposed in the first reference region, and the other second line is not disposed in the first reference region.

4. The electronic device of claim 1, wherein the first and second values are substantially equal.

5. The electronic device of claim 1, wherein the first width is substantially equal to a minimum spaced distance between the first and second pattern parts.

6. The electronic device of claim 5, wherein the number of the second cut line parts disposed in the first reference region is equal to a number of gaps between the first and second pattern parts which are disposed in the second region and have the minimum spaced distance.

7. The electronic device of claim 1, wherein the first width is greater than the minimum spaced distance.

8. The electronic device of claim 7, wherein the number of the second cut line parts disposed in the first reference region is less than number of gaps between the first and second pattern parts which overlap the second region and have the minimum spaced distance.

9. The electronic device of claim 1, wherein the first and second pattern parts receive or output predetermined signals.

10. The electronic device of claim 1, wherein the first pattern part is an electrode which receives or outputs a predetermined signal, and the second pattern part is a floating pattern.

11. The electronic device of claim 10, wherein cut line parts in which predetermined regions are cut are defined in each of the third lines and the fourth lines.

12. The electronic device of claim 1, wherein the second pattern part further comprises:
a third pattern line which is disposed between the third lines and in which third cut line parts are defined; and
a fourth pattern line which is disposed between the fourth lines and in which fourth cut line parts are defined.

13. The electronic device of claim 1, further comprising:
an insulating layer covering the first and second pattern parts;
a third pattern part disposed on the insulating layer and overlapping the first pattern part when viewed in a plan view, the third pattern part comprising:
fifth lines arrayed in the first direction, each of the fifth lines extending in the second direction;
a fifth pattern line disposed between the fifth lines and in which fifth cut line parts are defined;
sixth lines arrayed in the second direction, each of the sixth lines extending in the first direction, and
a sixth pattern line which is disposed between the sixth lines and in which sixth cut line parts are defined; and
a fourth pattern part disposed on the insulating layer and overlapping the second pattern part when viewed in a plan view, the fourth pattern part comprising:
seventh lines arrayed in the first direction, each of the seventh lines extending in the second direction; and
eighth lines arrayed in the second direction, each of the eighth lines extending in the first direction.

14. The electronic device of claim 13, wherein when viewed in a plan view, the first lines overlap the fifth pattern line, the first pattern line overlaps the fifth lines, the second lines overlap the sixth pattern line, and the second pattern line overlaps the sixth lines.

15. The electronic device of claim 13, wherein when viewed in a plan view, the first lines overlap the fifth lines, the first pattern line overlaps the fifth pattern line, the second lines overlap the sixth lines, and the second pattern line overlaps the sixth pattern line.

16. The electronic device of claim 15, wherein when viewed in a plan view, the first cut line parts do not overlap the fifth cut line parts, and the second cut line parts do not overlap the sixth cut line parts.

17. The electronic device of claim 13, wherein when viewed in a plan view, gaps between each of the second lines and the second pattern line and the fourth lines and gaps between each of the sixth lines and the sixth pattern line and the eighth lines do not overlap each other.

18. The electronic device of claim 13, wherein the third pattern part is electrically connected to the first pattern part through a first contact hole provided in the insulating layer, and the fourth pattern part is electrically connected to the second pattern part through a second contact hole provided in the insulating layer.

19. The electronic device of claim 1, further comprising a display layer disposed under the base layer and configured to display an image, wherein the base layer comprises a plurality of insulating thin films configured to cover the display layer.

20. A touch sensing unit comprising:
a first pattern part comprising first mesh lines in which a plurality of first cut line parts are defined; and
a second pattern part spaced apart from the first pattern part in a first direction and comprising second mesh lines in which a plurality of second cut line parts are defined,
wherein:
a first reference region is defined inside the first pattern part;
a second reference region having a same width and area as the first reference region in a second direction crossing the first direction is defined between the first and second pattern parts; and
a difference between a first value, which is a number of first cut line parts disposed in the first reference region among the first cut line parts multiplied by a width of each of the plurality of first cut line parts in the first direction, and a second value, which is a total sum of a minimum spaced distance between the first and second pattern parts which are disposed in the second reference region, is less than the second value.

21. The touch sensing unit of claim 20, wherein:
mesh lines extending in the second direction among the first mesh lines are not disposed in the first reference region; and
a configuration repeating unit, which is a minimum repeating unit of mesh lines extending in the first direction, is disposed in the reference region.

* * * * *